(12) United States Patent
Opower et al.

(10) Patent No.: US 8,027,018 B2
(45) Date of Patent: Sep. 27, 2011

(54) METHOD AND DEVICE FOR PRODUCING EXPOSED STRUCTURES

(75) Inventors: Hans Opower, Krailling (DE); Stefan Scharl, Wasserburg (DE); Dirk Leinenbach, Habach (DE)

(73) Assignee: KLEO Halbleitertechnik GmbH & Co KG, Tettnang (DE)

( * ) Notice: Subject to any disclaimer, the term of this patent is extended or adjusted under 35 U.S.C. 154(b) by 1817 days.

(21) Appl. No.: 11/071,074

(22) Filed: Mar. 2, 2005

(65) Prior Publication Data

US 2005/0282087 A1    Dec. 22, 2005

Related U.S. Application Data

(63) Continuation of application No. PCT/EP03/09215, filed on Aug. 20, 2003.

(30) Foreign Application Priority Data

Sep. 3, 2002 (DE) .................................. 102 42 142

(51) Int. Cl.
 G03B 27/42 (2006.01)
 G03B 27/32 (2006.01)
(52) U.S. Cl. ........................................... 355/53; 355/77
(58) Field of Classification Search .................. 355/53, 355/55, 30, 77; 430/311
See application file for complete search history.

(56) References Cited

U.S. PATENT DOCUMENTS

| | | | | |
|---|---|---|---|---|
| 4,541,712 A | * | 9/1985 | Whitney | 355/53 |
| 5,175,435 A | * | 12/1992 | Sakamoto et al. | 250/492.2 |
| 5,343,271 A | | 8/1994 | Morishige | |
| 5,546,225 A | * | 8/1996 | Shiraishi | 359/559 |

(Continued)

FOREIGN PATENT DOCUMENTS

WO    01/18606    3/2001

OTHER PUBLICATIONS

Grenon, B.J., et al., "A New Mask Lithography Tool for Advanced Mask Manufacturing," Microelectronic Engineering, Elsevier Publishers BV., Amsterdam, NL, vol. 27, No. 1, Feb. 1, 1995.

*Primary Examiner* — Edward J Glick
*Assistant Examiner* — Deoram Persaud
(74) *Attorney, Agent, or Firm* — Lipsitz & McAllister, LLC

(57) ABSTRACT

In order to improve a method for producing exposed structures on a plurality of components by means of an exposure unit, with which substrate member and the exposure unit are moved relative to one another, wherein identical structures are produced on at least some of the components, in such a manner that this operates as efficiently as possible it is suggested that each of the identical structures be produced by way of exposure of the substrate member in the area of the component respectively provided within a plurality of macrolines, that each of the macrolines comprise a plurality of lines lying next to one another, that during a single pass along a path of exposure all the components covered by this path of exposure be exposed with the exposure unit in the area of the same macroline of the plurality of macrolines, that the exposure unit have a plurality of light sources and a control with a control memory, with which sets of data already stored for the macroline, in the area of which exposure is being carried out, can be read out while sets of data of an additional macroline are being stored.

76 Claims, 12 Drawing Sheets

U.S. PATENT DOCUMENTS

| | | | |
|---|---|---|---|
| 5,652,660 A * | 7/1997 | Seto et al. | 358/300 |
| 5,812,152 A * | 9/1998 | Torigoe et al. | 347/2 |
| 5,874,929 A * | 2/1999 | Opower et al. | 345/32 |
| 5,909,658 A | 6/1999 | Clarke et al. | |
| 6,002,466 A | 12/1999 | Brauch et al. | |
| 6,064,807 A * | 5/2000 | Arai et al. | 430/30 |
| 6,268,929 B1 | 7/2001 | Ono | |
| 6,407,765 B1 * | 6/2002 | Abe | 347/237 |
| 6,586,169 B2 * | 7/2003 | Brauch et al. | 430/394 |
| 6,833,854 B1 * | 12/2004 | Sandström | 347/239 |
| 6,870,604 B2 * | 3/2005 | Kanatake | 355/77 |
| 2002/0030733 A1 | 3/2002 | Ressel et al. | |
| 2002/0180944 A1 * | 12/2002 | Fujii et al. | 355/70 |
| 2003/0214641 A1 * | 11/2003 | Uemura et al. | 355/40 |
| 2005/0213064 A1 * | 9/2005 | Katayama et al. | 355/52 |

\* cited by examiner

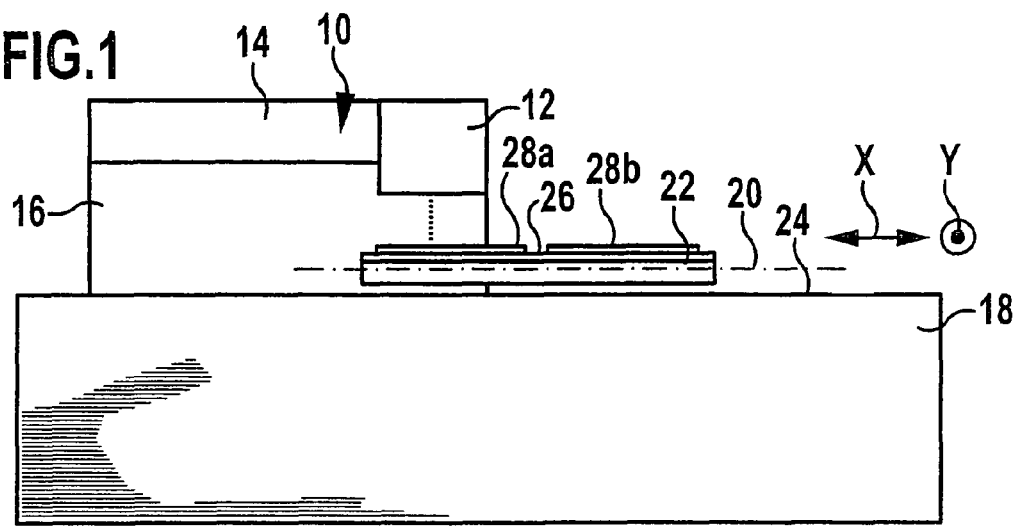
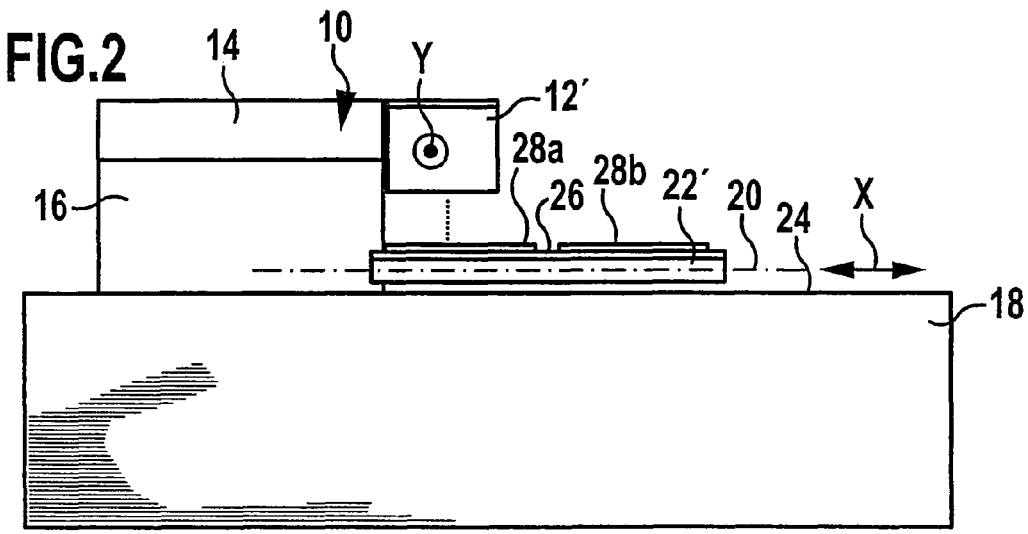
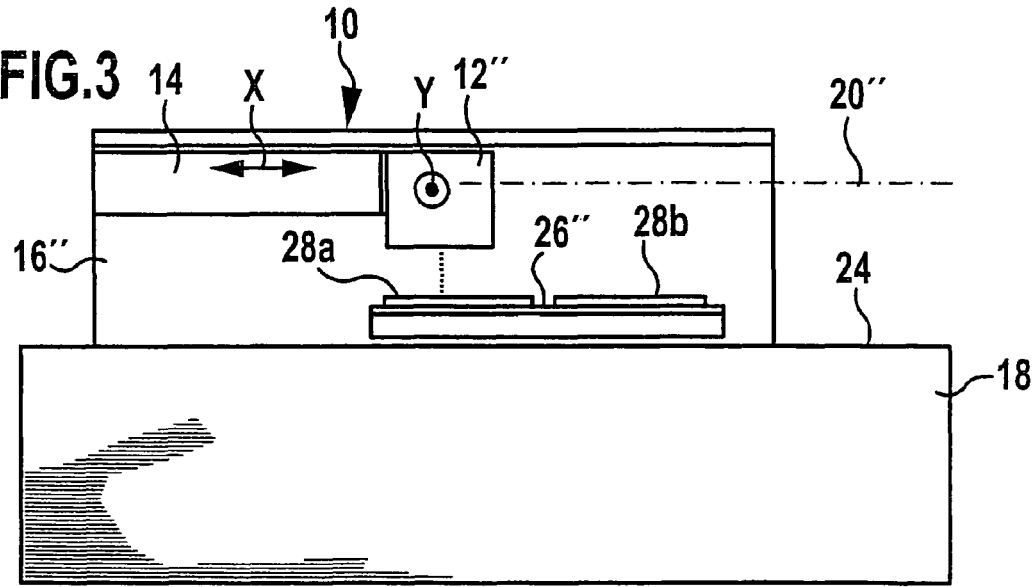

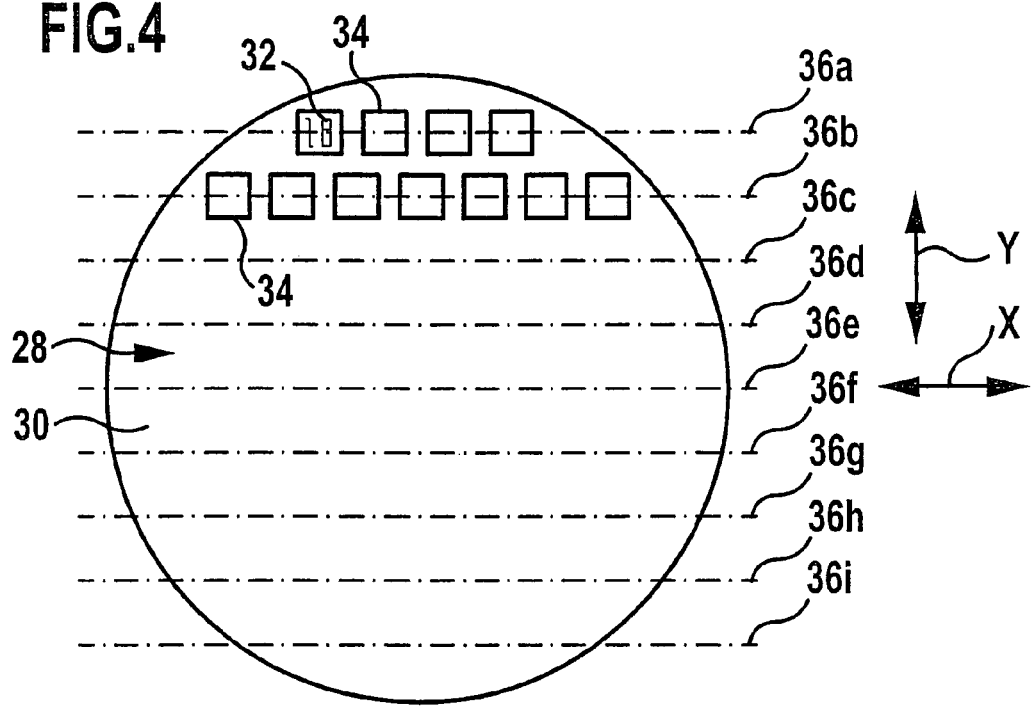
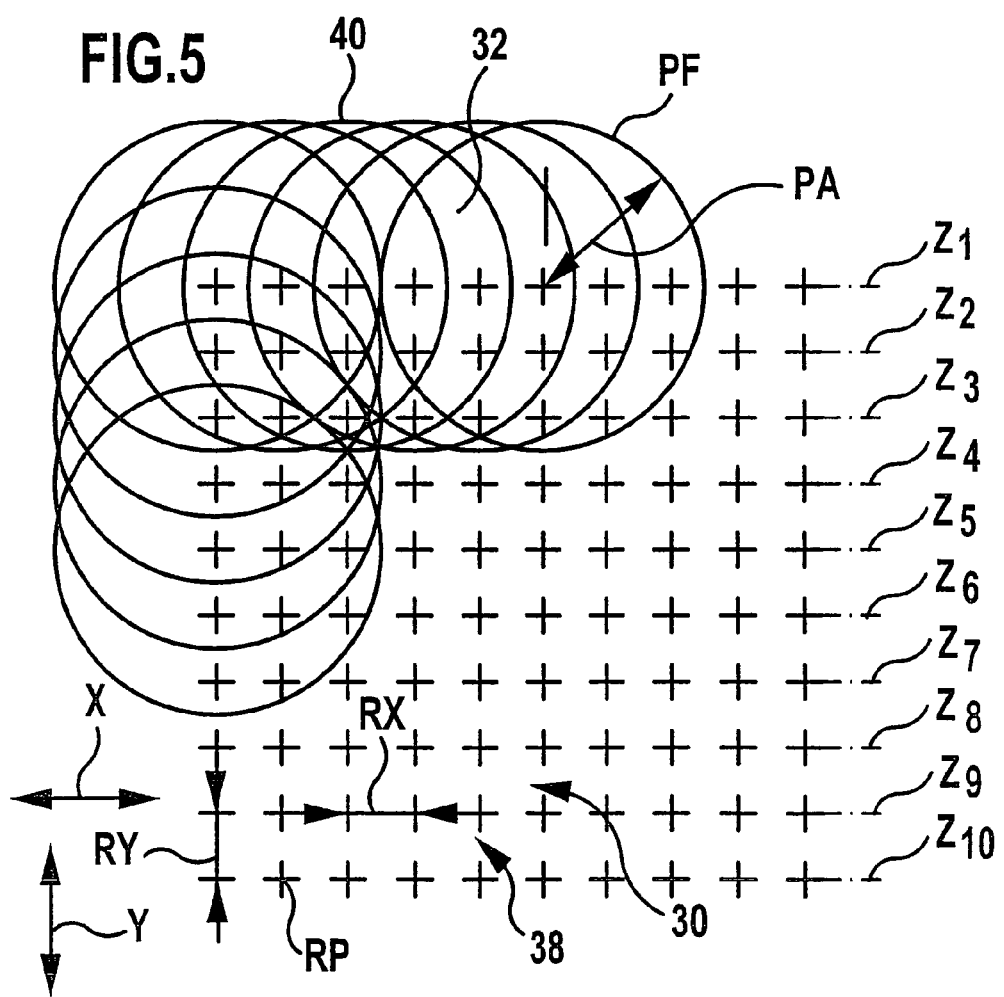

METHOD AND DEVICE FOR PRODUCING EXPOSED STRUCTURES

This application is a continuation of International application number PCT/EP2003/09215 filed on Aug. 20, 2003.

The present disclosure relates to the subject matter disclosed in International application number PCT/EP2003/09215 of Aug. 20, 2003 and German application number 102 42 142.0 of Sep. 3, 2002, which are incorporated herein by reference in their entirety and for all purposes.

The invention relates to a method for producing exposed structures on a plurality of components arranged on at least one substrate member by means of an exposure unit, with which at least one substrate member arranged on a substrate carrier and the exposure unit are moved relative to one another in a main direction and transversely to this in a secondary direction, wherein identical structures are produced on at least some of the components.

A method of this type is known from the state of the art, wherein the problem is to be found in the lack of efficiency of this method.

The object underlying the invention is therefore to improve a method for producing exposed structures of the generic type in such a manner that this operates as efficiently as possible.

This object is accomplished in accordance with the invention, in a method for producing exposed structures, in that each of the identical structures is produced by way of exposure of the substrate member in the area of the component respectively provided within a plurality of macrolines extending in the main direction and lying next to one another in the secondary direction, that each of the macrolines comprises a plurality of lines extending in the main direction and lying next to one another in the secondary direction, that during a single pass along a path of exposure all the components to be provided with identical structures and covered by this path of exposure are exposed with the exposure unit in the area of the same macroline of the plurality of macrolines, that the exposure unit has a plurality of light sources and a control activating them essentially at the same time and having a control memory which is constructed such that sets of data already stored for the macroline, in the area of which exposure is being carried out, can be read from this memory while sets of data of an additional macroline are being stored.

The advantage of the solution according to the invention is to be seen in the fact that the control memory can be used efficiently due to the fact that, on the one hand, the sets of data of the corresponding macroline which are used for the purpose of exposure can be read out from it while sets of data of an additional macroline can be stored and that, in addition, the time, during which the sets of data used for the purpose of exposure are being read out, is kept as long as possible due to the fact that the path of exposure extends over several components so that, on the other hand, as long a period of time as possible is available for the storing of sets of data of the additional macroline provided for the later exposure.

As a result, it is possible to expose the components of the at least one substrate member where possible without interruption of the relative movement between exposure unit and substrate carrier and, therefore, to avoid unnecessary pauses and so, altogether, the exposure of the components on the substrate member takes place with the greatest possible efficiency.

A path of exposure is to be understood as the path which extends over all those components, in the case of which an exposure takes place in the area of the same macrolines, wherein an actual exposure of the substrate need not always take place on the section of the path between consecutive components or also on other sections of the path.

For example, it is also conceivable within the scope of the solution according to the invention to produce different types of components on a substrate efficiently since it is possible on account of the design of the control memory according to the invention to already store macrolines for the other type of components during the reading out of the macrolines for the one type of components and, therefore, to also be able to transfer smoothly from the exposure of the one type of components to the exposure of the other type of components.

A method according to the invention is particularly advantageous when the path of exposure is selected to be at least of such a length that the time for passing along the same corresponds at least to the time which is required for storing at least half the sets of data of the additional macroline in the control memory.

This procedure permits the control memory to be selected with respect to its size such that it is in a position to save approximately half the macrolines required for one type of components since during the reading out of these macrolines for the purpose of exposure in the area thereof additional macrolines can respectively be saved.

An even greater reduction in the control memory may be achieved when the path of exposure is selected to be at least of such a length that the time for passing along the same corresponds at least to the time which is required for storing at least two thirds of the sets of data of the additional macroline in the control memory.

A particularly optimum configuration provides for the path of exposure to be selected to be at least of such a length that the time for passing along the same corresponds at least to the time which is required for storing the sets of data of the additional macroline in the control memory.

In this case, it is, theoretically, merely necessary to select the control memory to be of such a size that two macrolines can be saved, namely the macroline, the exposure of which is taking place at the respective moment and the sets of data of which are therefore read out while the sets of data of the other macroline, in the area of which the next exposure is intended to take place, can be read in during the pass along the path of exposure.

With respect to the guidance of the path of exposure, the most varied of solutions are conceivable.

For example, it is conceivable for the path of exposure to extend only over one substrate member.

However, in order to keep the path of exposure as long as possible it is preferably provided for the path of exposure to extend over several substrate members.

Furthermore, it is—in particular, in order to configure the movement of the substrate carrier to be as simple as possible—of advantage when the path of exposure extends in a straight line in the main direction since no supplementary movement in the secondary direction is then required during the relative movement between the exposure unit and the substrate carrier in the main direction and, as a result, the precision is better and the speed of exposure is greater.

It is particularly simple when the path of exposure extends exclusively and in a straight line in the main direction since only a respective movement in the main direction is then required for a path of exposure and a further path of exposure can be commenced following a subsequent movement in the secondary direction.

It is, however, also conceivable to select the path of exposure such that the path of exposure extends in the main and in the secondary directions.

In this respect, it would, for example, be conceivable to have the path of exposure extending such that this extends once in the main direction, then at least once in the secondary direction and then at least once more in the main direction but in the opposite direction.

A solution which is particularly preferred for the lengthening of the path of exposure provides for the path of exposure to extend in a meandering shape, wherein the meanders preferably have sections extending in a straight line at least in the main direction.

With respect to the arrangement of the components there are also possibilities of increasing the efficiency of the method according to the invention.

It is particularly favorable, for example, when the components are arranged on the substrate members in rows which extend parallel to the main direction since the paths of exposure may then be placed in a favorable manner such that they have sections extending in a straight line in the main direction.

In this respect, an arrangement, with which the path of exposure comprises at least one row of components, is particularly efficient.

The path of exposure may be placed even more advantageously when this comprises all the components which are arranged in a row extending in the main direction on one substrate carrier in order to achieve as great a length as possible with a simple type of guidance for the path of exposure and, as a result, as long a time as possible for passing along the path of exposure.

It is, however, also conceivable to guide the path of exposure such that it covers several rows of components.

In order to keep the movement in the secondary direction as small as possible and, as a result, keep the time for the movement in the secondary direction as short as possible it is preferably provided for the several rows of components to be located next to one another.

A preferred embodiment of a solution according to the invention provides for the path of exposure to cover one row of components and to then switch transversely to the main direction to an additional row of components and to cover these.

In this respect, it is preferably provided for the path of exposure to pass along this additional row of components in a reverse direction to the one row of components.

In this respect, it is particularly expedient when the additional row is the next row following the one row in the secondary direction.

In principle, it would be conceivable to expose the plurality of lines of a macroline by means of a single light source which must then be moved quickly back and forth over the respective plurality of lines.

However, in order to be able to carry out exposure in the main direction with as great a speed as possible and, as a result, to achieve as great an efficiency as possible, it is preferably provided for the entire plurality of light sources of the exposure unit to be provided for the exposure of the plurality of lines of one macroline so that the exposure unit is in a position to carry out the exposure in the area of a macroline with all the light sources available.

In this respect, the entire plurality of light sources of the exposure unit is operated via the control at the same time in order to be able to carry out the exposure in the area of the macroline with as great a speed as possible in the main direction and, as a result, with as great an efficiency as possible.

A particularly favorable concept which ensures, on the one hand, that the sets of data are kept available for the plurality of macrolines of at least one component but, on the other hand, also ensures as rapid an access as possible to the sets of data of the macroline, in the area of which an exposure is intended to just take place, provides for the control memory to communicate via an interface with at least one main memory which stores at least the sets of data of the plurality of macrolines of one component.

With respect to the design of the control memory, no further details have so far been given. In order to be able to design this, on the one hand, so as to be inexpensive and, on the other hand, so as to operate as efficiently as possible, it is preferably provided for the control memory to comprise several control memory modules and for the control to communicate with the several control memory modules of the control memory at the same time.

As a result, it is possible, on the one hand, to achieve a sufficiently large capacity of the control memory by means of the control memory modules but, on the other hand, to be able to have access at the same time to as large an area as possible of the control memory at the same time.

With respect to the combination and the use of the several control memory modules, it has proven to be particularly advantageous when several control memory modules are combined by means of a control module to form a control memory unit and communicate via this with the control.

In this respect, it is likewise preferably provided for a storing of sets of data from the main memory in the control memory modules to also take place via the control modules.

With respect to the data format, in which the sets of data are saved in the main memory and in the control memory, no further details have so far been given.

It is conceivable, for example, to save the sets of data, in principle, in a machine-oriented data format so that they can also be transferred in this data format from the main memory to the control memory.

In order to be able to save and read out the data in the main memory more efficiently, it is preferably provided for the sets of data to be saved in the main memory in a volume-reduced data format and for a conversion into a machine-oriented data format to be carried out prior to the sets of data being read into the control memory.

For example, a volume-reduced data format is a vector data format. It can, however, also be a different volume-reduced data format.

The machine-oriented data format is preferably a pixel data format which is particularly suitable for the activation of the individual light sources; a different machine-oriented data format is, however, also conceivable.

The conversion of the data format could take place, for example, directly during the reading out from the main memory. It is, however, particularly favorable when the conversion of the data format takes place immediately prior to a transfer of data to the control module in order to be able to carry out the transfer of data with the volume-reduced data format which shortens the transfer time until the data are transferred to the control module.

In this respect, it is particularly favorable when the control memory is divided into several control memory units and, therefore, the control receives sets of data from several control memory units for the simultaneous activation of the light sources.

With respect to the size of the control memory, no further details have been given in conjunction with the preceding explanations concerning the individual embodiments. One particularly advantageous solution provides, for example, for the control memory associated with the control to be designed for storing at least two macrolines.

Apart from this minimum size it is likewise advantageous when the control memory associated with the control is designed for storing less than half the plurality of macrolines of a component in order to be able to realize the control memory as inexpensively as possible.

It is even better when the control memory associated with the control is designed for storing less than a quarter of the plurality of macrolines of a component.

The plurality of light sources which are used in accordance with the invention for the purpose of carrying out the exposure in the area of a macroline could be configured with respect to the realization of the activation thereof such that the plurality of light sources experiences no more subdivision whatsoever.

The activation of the light sources may, however, be configured more efficiently when the plurality of light sources is formed from a plurality of groups of light sources, wherein each group of light sources again has a plurality of light sources.

A particularly advantageous control concept provides for each group of light sources to have its own group control associated with it and for the light sources of the group of light sources to be controlled by this group control exclusively and independently of the other groups of light sources.

In conjunction with the description of the preceding embodiments, no further details have been given concerning the positioning of the exposure unit and the substrate members relative to one another in the secondary direction, in particular, concerning the correction of positioning errors of the substrate members relative to the exposure unit.

In principle, it is conceivable to correct all positioning errors of the substrate members in the secondary direction in that the drive device for the positioning in the secondary direction is controlled accordingly and, as a result, a corresponding positioning of the substrate member is corrected.

One particularly advantageous solution provides, however, for the number of structure lines which define the structure of the component to be smaller than the total number of lines, in which an exposure can be carried out in the area of the component by means of the exposure unit, and for a fine positioning in the secondary direction to be brought about by way of a variation in the allocation of the structure lines to the lines which can be exposed with the exposure unit.

The advantage of this solution is to be seen in the fact that at least the fine positioning of straight, parallel paths in the secondary direction need not be brought about by means of a physical displacement of the substrate member but by means of the allocation of the structure lines to the lines which can be exposed with the exposure unit by means of the software and so the delay effects caused with a physical positioning on account of the mass inertia can be avoided at least with respect to this fine positioning. The fine positioning is to be carried out by means of the software in a more comprehensive manner, for example, also in the case of paths which are not straight or not parallel.

The fine positioning may be realized particularly quickly when the change in the allocation is carried out by the control for the light sources since, in this case, a correction with a time constant which is very small may still be realized immediately prior to the actual exposure of the substrate.

A particularly favorable solution provides in this respect for sets of data of a number of structure lines to be stored in the control memory for each macroline, this number being greater than the plurality of the lines exposable in the area of this macroline by the exposure unit, so that a correction of positioning errors of the substrate member in the secondary direction can be carried out immediately in the area of each macroline.

Particularly when the light sources are combined to form groups of light sources, one advantageous solution provides for data sets for a subset of the structure lines of the structure to be exposed to be made available to the group control, wherein the number of structure lines of the subset is greater than the number of lines actually exposable by the group of light sources within a group strip.

In this respect, it is provided, in particular, for the sets of data of subsets of the structure lines of the structure to be exposed, which are made available to the groups of light sources located next to one another, to comprise structure lines which are contained in both subsets.

In this respect, the structure lines contained in both subsets expediently form an overlapping area, wherein the remaining structure lines of the subsets are respectively located on opposite sides of the overlapping area.

No further details have so far been given with respect to the lines which can be exposed with each light source.

In principle, it would be conceivable to provide a light source for each line to be exposed. It is, however, particularly favorable when a line strip comprising several lines can be exposed with each light source.

In order to increase the efficiency of the method according to the invention, it is, in addition, advantageous when several exposure devices, each comprising a substrate carrier and an exposure unit which carry out a relative movement in relation to one another, are used.

As a result, the number of components produced per time unit can be increased in a simple manner.

In this respect, it is particularly favorable when in the case of two exposure devices the relative movements in the main direction take place in opposite directions in order to compensate as far as possible for the effects resulting due to the mass inertia.

A further, advantageous solution provides for the relative movements in the secondary direction to take place, in the case of two exposure devices, in opposite directions in order to likewise compensate for the effects of the mass inertia.

A particularly favorable solution provides for four exposure devices to be used and for the relative movements in the main direction and the relative movements in the secondary direction to take place in opposite directions for respective pairs.

The invention does, however, also relate to a device for producing exposed structures on at least one substrate member by means of an exposure unit, with which at least one substrate member arranged on a substrate carrier and the exposure unit are movable relative to one another in a main direction and transversely to this in a secondary direction.

The object specified at the outset is accomplished in accordance with the invention, in this device, in that the exposed structures can be produced by exposure of the substrate member within a plurality of macroline extending in the main direction and lying next to one another in the secondary direction, that each of the macrolines comprises a plurality of lines extending in the main direction and lying next to one another in the secondary direction and that the exposure unit has a plurality of light sources and a control activating them essentially at the same time and having a control memory which is designed such that sets of data already stored for the macroline, in the area of which exposure is being carried out, can be read out of the control memory while sets of data of an additional macroline can be stored.

The device according to the invention serves not only the purpose of carrying out the method according to the invention and described above but it can also be used for a simple exposure during the production of photolithographic masks or large-format components and is not, therefore, limited to producing exposed structures on a plurality of components arranged on at least one substrate member by means of the exposure unit.

The advantage of the device according to the invention is, however, still that of being able to produce the exposed structure efficiently with the device according to the invention.

Additional, advantageous developments of such a device are the subject matter of claims 46 to 65 and have features of the advantageous developments of the method according to the invention as described above.

The device according to the invention may, however, also be used for producing exposed structures on a plurality of components arranged on at least one substrate member by means of the exposure unit, wherein identical structures are produced on at least some of the components.

In this respect, it is provided in the case of the embodiment provided for this of the device according to the invention that each of the identical structures is produced by exposure of the substrate member in the area of the component respectively provided within a plurality of macrolines extending in the main direction and lying next to one another in the secondary direction, wherein each of the macrolines comprises a plurality of lines extending in the main direction and lying next to one another in the secondary direction, wherein during a single pass along a path of exposure all of the components to be provided with identical structures and covered by this path of exposure can be exposed with the exposure unit in the area of the same macroline of the plurality of macrolines and wherein the exposure unit has a plurality of light sources and a control activating them essentially at the same time and having a control memory which is designed such that sets of data already stored on it for the macroline, in the area of which exposure is being carried out, can be read out while sets of data of an additional macroline can be stored.

Additional features and advantages of the invention are the subject matter of the following description as well as the drawings illustrating several embodiments.

In the drawings:

FIG. 1 shows a schematic side view of a first embodiment of an exposure device according to the invention;

FIG. 2 shows a schematic side view similar to FIG. 1 of a first variation of the first embodiment;

FIG. 3 shows a schematic side view similar to FIG. 1 of a second variation of the first embodiment;

FIG. 4 shows a plan view of a substrate member with the components provided on it;

FIG. 5 shows a sectional illustration of a pattern, in which exposure is carried out by way of pixel dots with the exposure unit according to the invention;

Figure 6:
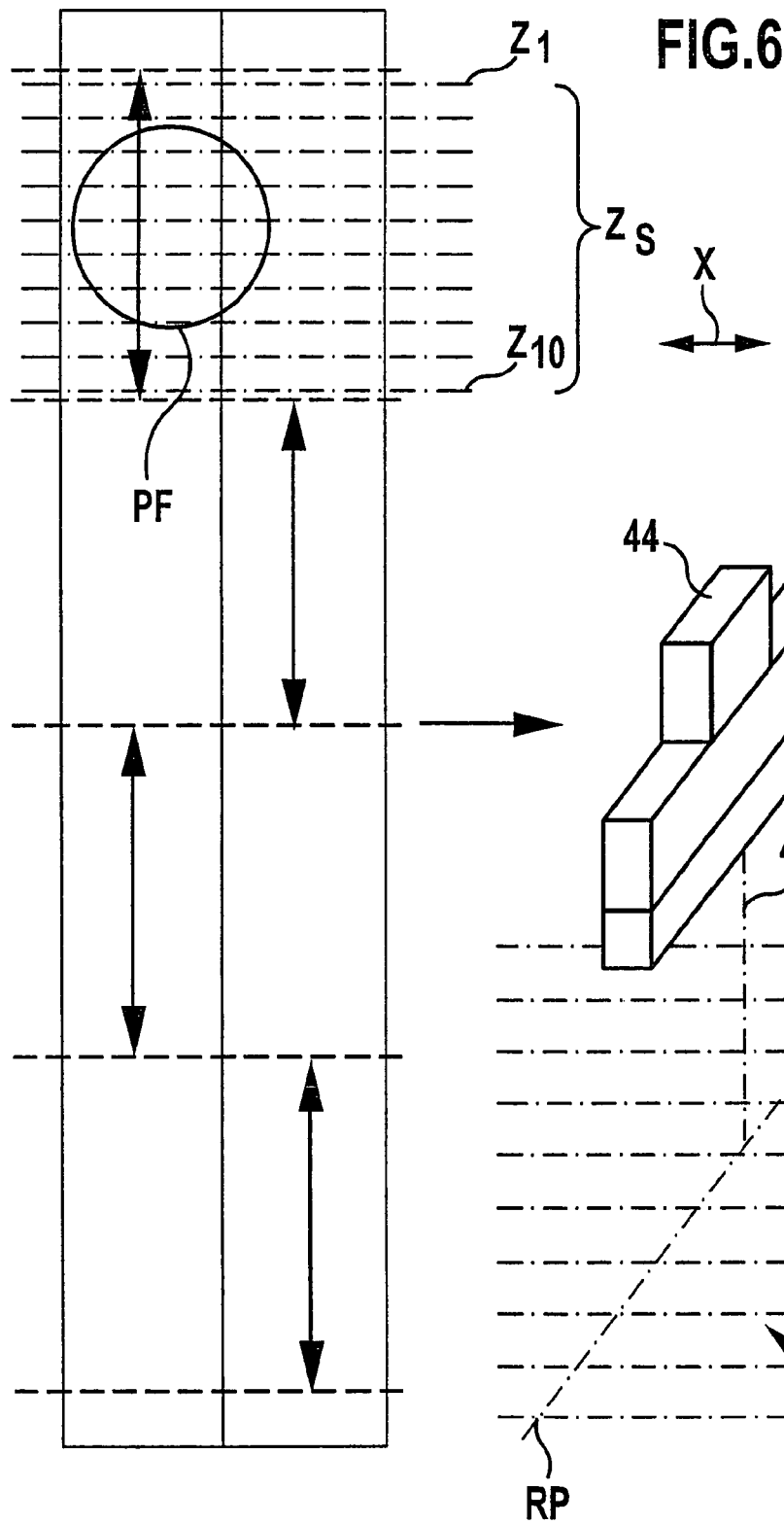
FIG. 6 shows a schematic illustration of the exposure according to the invention within a line strip by way of deflection of an exposure beam and displacement of the pixel dot related thereto.

One embodiment of a device according to the invention for exposing substrate materials, illustrated in FIG. 1, comprises an exposure unit 10 which comprises an optics head 12 and an exposure control 14 associated with it.

The exposure unit 10 is supported, for example, on a base member 18 by means of a bridge member 16.

The bridge member 16 engages over an area of movement 20, in which a carrier slide 22 can be moved relative to the base member 18, wherein the carrier slide 22 is guided on a guide plane 24 of the base member 18 for sliding displacement, for example, by cushions of air, as described in German patent application 101 12 344.6, to which reference is made in full in this respect.

Furthermore, a substrate carrier 26, on which two substrate members 28a, b provided for exposure are, for example, held, is also arranged on the carrier slide 22; these substrate members are intended to be exposed by the exposure unit 10.

For this purpose, the carrier slide 22 can be moved within the area of movement 20 by drive units for the carrier slide 22 not illustrated in FIG. 1, for example, not only in an X direction as main direction but also in a Y direction as secondary direction extending at right angles to this main direction, the main direction and secondary direction both extending parallel to the guide plane 24, and can be positioned exactly relative to the exposure unit 10, in particular, to the optics head 12 thereof.

The area of movement 20 for the carrier slide 22 is dimensioned such that the substrate members 28 can be exposed on their entire substrate surface 30.

It is, however, also conceivable to move the carrier slide 22' in X direction and to move the optics head 12' relative to the bridge member 16 in Y direction, as illustrated in FIG. 2.

Alternatively thereto, it is also conceivable to arrange the substrate carrier 26 so as to be stationary and to move the optics head 12" relative to the substrate carrier 26 and relative to the bridge member 16" in X and Y directions in an area of movement 20" in order to likewise expose the entire surface 30 of the respective substrate, as illustrated in FIG. 3.

A substrate member 28 of this type is, for example, a so-called wafer—as illustrated in FIG. 4—such as that used in semiconductor technology. The exposure of the wafer takes place for the purpose of generating defined structures 32 on it, wherein one or more structures 32 of this type then result in a component 34, for example, an electrical, an electronic or an optical element.

In this respect, the defined structures 32 do not extend over the entire surface 30 of the substrate member 28 but rather a plurality of components 34 can generally be produced on a substrate member 28 of this type, wherein all the components 34 are built up, in particular, by means of the same structures 32.

In order to produce the components 34, these are preferably arranged on the substrate member 28 in rows 36, wherein the rows 36 preferably extend parallel to the main direction X and at right angles to the secondary direction Y.

In order to produce the defined structures 32 for the components 34, it is now necessary to provide each of the components 34 with the same structure 32 by way of exposure with the exposure unit 10.

For this purpose, a relative movement is preferably generated between the exposure unit 10 and the substrate carrier 26 along the main direction X such that all the components 34 of one of the rows 36 are preferably traveled over in one pass due to the relative movement in the main direction X and thereby exposed and, subsequently, following offsetting in the secondary direction Y, a pass over and exposure of all the components 34 of one of the rows 36 likewise takes place.

The production of the structures takes place, as illustrated in FIG. 5, by way of exposure of the surface 30 of the substrate carrier within the area of the respective components 34 in a grid pattern 38, consisting of individual grid points RP which have a grid spacing RX and RY from one another, wherein this grid spacing RX, RY is, for example, in the order of magnitude of 50 nanometers.

Each grid point RP represents a center of a pixel dot PF which has, proceeding from the center RP, a pixel extension PA which is a multiple of the grid spacing RX, RY, for example, up to approximately five times the same.

If the pixel dots PF are therefore exposed in the grid pattern 38 with the grid points RP as the center of pixel dots PF located next to one another, coherent structures 32 may be generated, with which pixel dots PF located next to one another overlap several times, for example, five times so that structural edges 40 of the exposed structure 32, which extend in a relatively straight line, may be generated from consecutive pixel dots PF in the case of pixel dots PF seated along consecutive grid points RP.

In order to be able to utilize the relative movement between the substrate carrier 26 and the optics head 12 in a suitable manner for positioning the individual pixel dots PF in the grid pattern 38, the grid points RP are arranged in lines Z, for example, the lines Z1 to Z10 in FIG. 5 which extend parallel to the main direction X and at right angles to the secondary direction Y and, therefore, also parallel to the rows 36.

In principle, it would be conceivable to design the exposure unit 10 such that a separate exposure beam 42 is available for the exposure in each of the lines Z at any time so that during the relative movement between the exposure unit 10 and the substrate carrier 26 in the main direction X, for example, a pixel dot PF could be generated in all the lines Z at a specific point in time.

In a particularly favorable solution, as illustrated in FIG. 6, it is provided for the exposure beam 42 provided for generating a pixel dot PF to be movable in the secondary direction Y over the grid pattern 38 such that the pixel dot PF can be positioned with its center, for example, on each of 10 lines Z1 to Z10.

Figure 7:
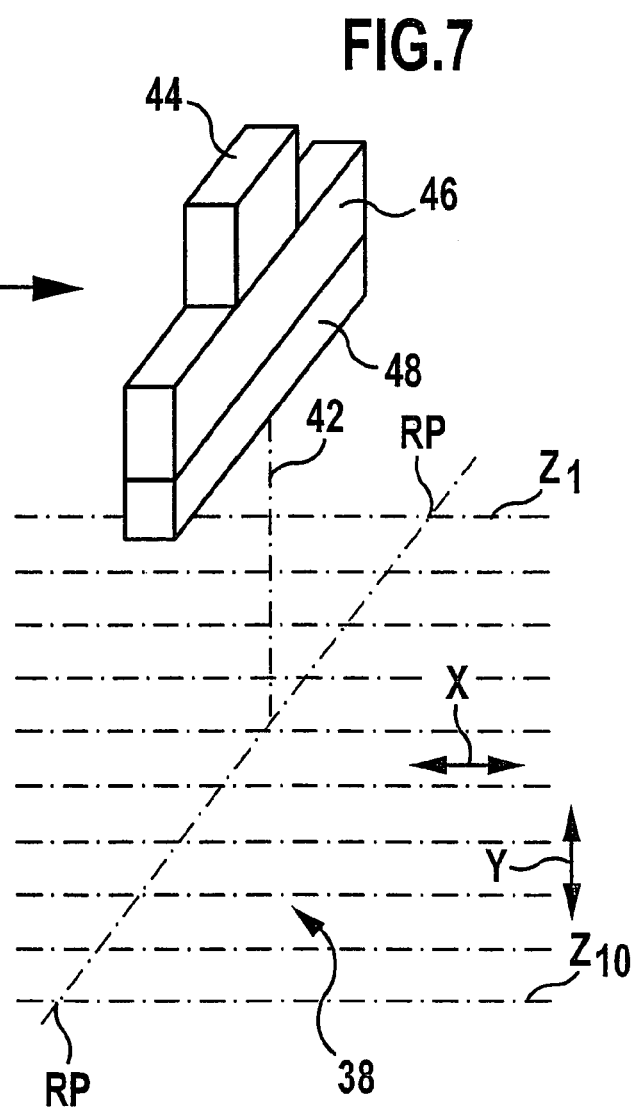
FIG. 7 shows a schematic illustration of a light source with deflection unit and optical imaging device for the displacement of a pixel dot within a line strip.

For this purpose, a light source 44, for example, in the form of a laser diode is provided, for example, for generating the exposure beam 42, the light beam of this light source being deflectable by means of a deflection unit 46 combined with a microscope lens system 48 in such a manner that the exposure beam 42 can generate a pixel dot PF on the surface 30 of the substrate, the center of which can be positioned on each of the lines Z1 to line Z10 in the respective grid point RP (FIG. 7).

The lines Z1 to Z10 which can be covered by the light source 44 with the exposure beam 42 therefore form a line strip ZS which extends, as illustrated in FIG. 6, in the main direction X.

Figure 8:
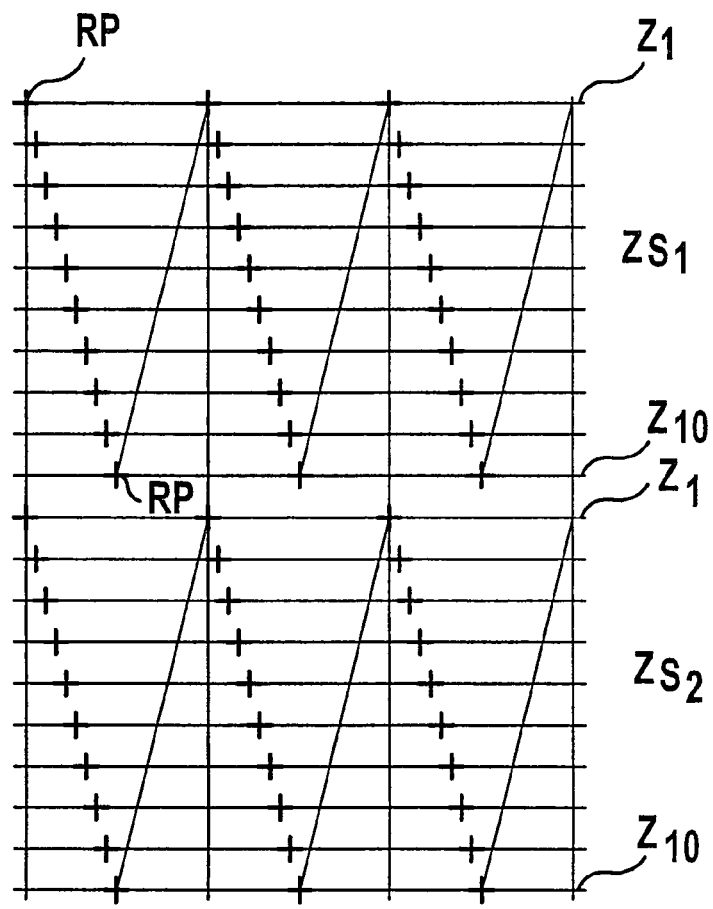
FIG. 8 shows a schematic illustration with an extended main direction not to scale of a pattern which results during periodic movement of the exposure beam over the line strip.

As illustrated in FIG. 8 with a grid spacing RX drawn on a larger scale in the main direction X in comparison with the grid spacing Y, the exposure beam 42 is deflected periodically by the deflection unit 46 in order to cover the lines Z1 to Z10 of a line strip and therefore pans with a predetermined time constant from the line Z1 to the line Z10 and back to it again so that when a pixel dot PF is intended to be generated with a center on one of the lines Z1 to Z10 an exposure must take place at that point of time, at which the exposure beam 42 is located with its center exactly on the selected line Z of the line strip during the periodic panning movement of the exposure beam 42.

This does lead to a slight distortion of the grid pattern 38 to the extent that the grid points RP in the line Z10 are shifted in the main direction X by a grid spacing RX/2 in comparison with the grid points RP in the line Z1 but this distortion is negligible on account of the extension of the pixel dots PF relative to the grid spacings RX and RY.

Figure 9:
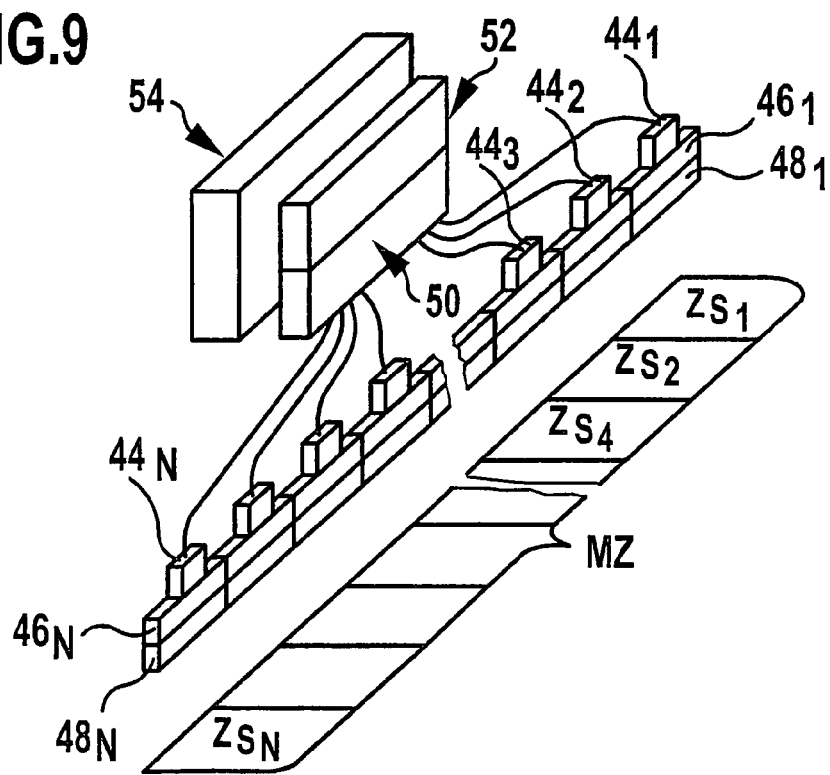
FIG. 9 shows a schematic illustration similar to FIG. 7 of the plurality of light sources with deflection units and optical imaging devices for generating the exposure within a macroline.

In order to be able to expose not only one line strip ZS1 with the exposure unit 10 according to the invention, in particular, the optics head 12 but also, for example, N line strips ZS (FIG. 9), a plurality of light sources $44_1$ to $44_N$ with corresponding deflection units $46_1$ to $46_N$ and microscope lens systems $48_1$ to $48_N$ are provided in the optics head 12 and can all be operated at the same time during a relative movement between the optics head 12 and the substrate carrier 26 in the main direction X.

In order to be able to expose as many lines Z as possible with the exposure unit 10 according to the invention during a single movement in the main direction X, a large number N of light sources 44 with deflection units 46 and microscope lens systems 48 are used. In this respect, numbers of several hundred light sources 44 are appropriate, for example, 504 light sources which are therefore in a position to carry out an exposure by way of a pixel dot PF in the area of 5040 lines Z during a movement in the main direction X.

In addition, several grey levels are provided for a pixel dot PF, for example, more than 10 grey levels, preferably 32 grey levels per pixel dot PF in order to be able to generate defined structures 32, in particular, with well defined structure edges 40.

At a relative speed between the exposure unit 10 and the substrate carrier 26 in the order of magnitude of one meter per second, this leads to volumes of data and data transfer rates which go to technological range limits of the component parts available at grid spacings RX, RY in the range of around 50 nanometers.

For this reason, it is not possible to read the data required for writing the lines Z within the line strips ZS1 to ZSN from the memory of a primary computer, for example, a host computer during the exposure procedure with a movement in the main direction X but rather it is necessary to provide a control 50 for the simultaneous activation of the light sources 44 which has its own control memory 52 associated with it which allows the control 50 to read the sets of data for the sets of lines ZS1 to ZSN with as great a data transfer rate as possible.

Since a typical component 34, which is intended to be provided with a defined structure 32 on a substrate by way of exposure in a manner in accordance with the invention and normally has dimensions in the range of up to several centimeters, the exposure unit 10 provided, for example, with several hundred light sources 44 is also not in a position to carry out exposure in the area of all the lines Z required for the production of the structure 32 of the component 34.

Figure 10:
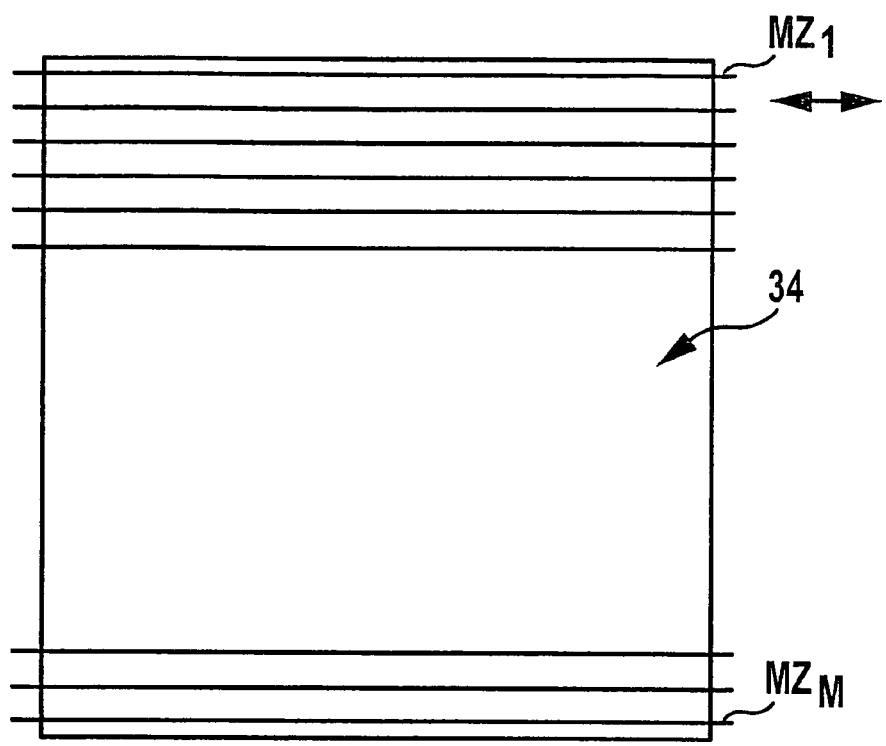
FIG. 10 shows a schematic illustration of the plurality of macrolines which are necessary in order to be able to generate optional structures in the area of a component.

On the contrary, it is necessary, as illustrated in FIG. 10, to travel over the component 34 with the exposure unit 10 according to the invention several times in the main direction X but offset in the secondary direction Y and thereby expose it.

The lines which can be exposed during a single pass over the component 34 in the main direction X with the light sources $44_1$ to $44_N$, comprised in the sets of lines ZS1 to ZSN, are designated in this respect as macroline MZ and so for the exposure of all the lines necessary for the structure 32 of the component 34, as illustrated in FIGS. 7 and 8, an exposure of the component 34 altogether in the area of M macrolines MZ located next to one another is required.

Since the control 50 activating the light sources 44 must have quick access to the control memory 52, it would be necessary, when altogether M macrolines MZ have to be exposed, to store the sets of data for all M macrolines MZ of the component 34 in the control memory 52.

This would result in the control memory 52 needing to be of a very large configuration and, therefore, it would be very costly.

For this reason it is provided for the control memory 52 to be designed such that sets of data for the exposure of the lines Z can be read from it by the control for the light sources 44 but at the same time sets of data from a main memory 54 of a primary computer, for example, the host computer can also be read into it. As a result, it is possible to read in sets of data for an additional macroline MZ during the exposure in the area of one macroline MZ and, therefore, the reading out of the sets of data for this exposure.

Figure 11:
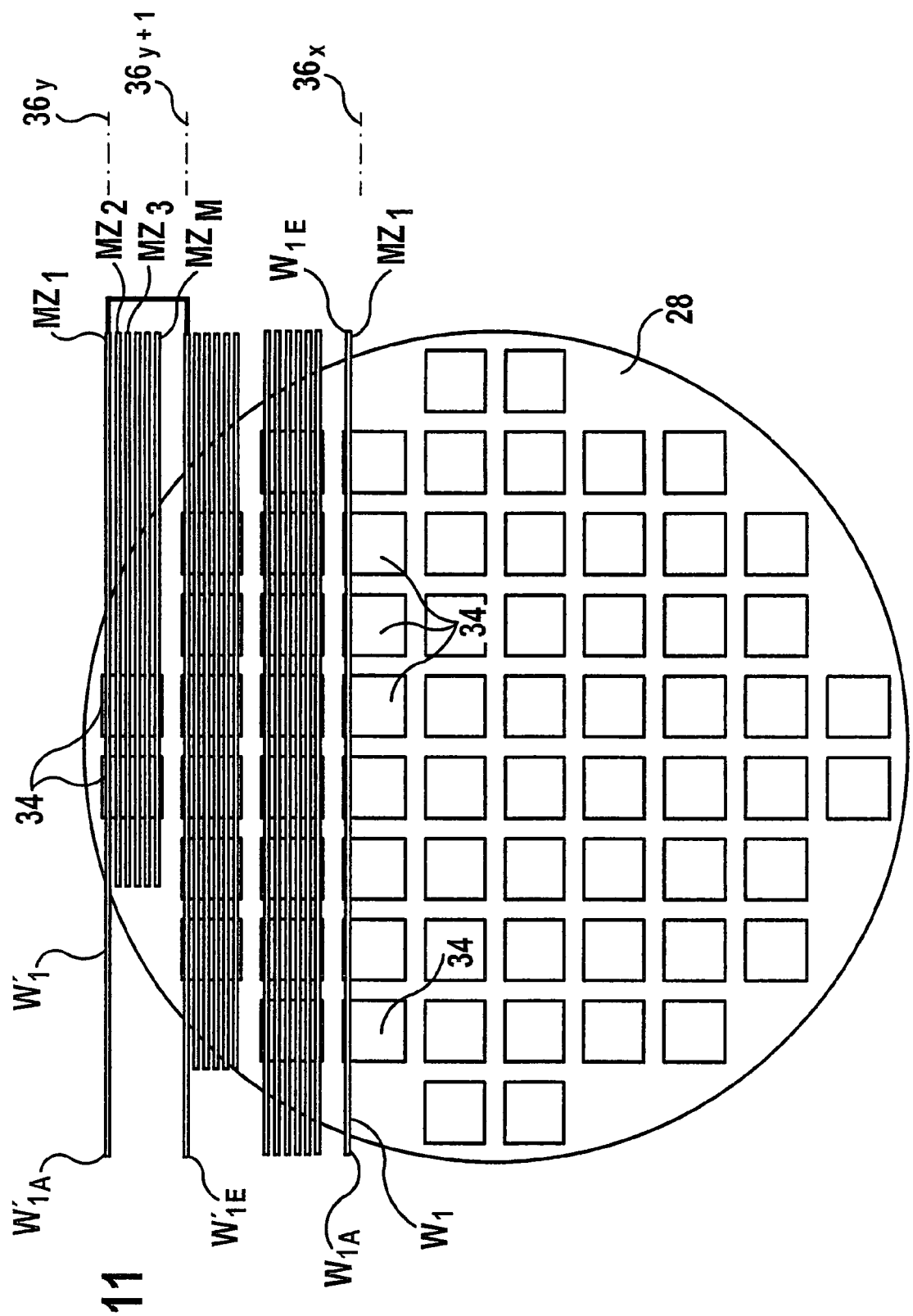
FIG. 11 shows a schematic illustration of two possibilities for realizing a path of exposure.

It is, in addition, advantageous within the scope of the solution according to the invention, as illustrated in FIG. 11, to carry out an exposure in the area of one of the macrolines MZ not only in the area of a single component 34 but rather in the area of several components 34, wherein these components 34 are arranged along a path of exposure W. The size of the control memory 52 is dependent on the length of time which is required for a path of exposure W and how quickly the sets of data from the main memory 54 can be stored in the control memory 52.

In the simplest case, a first path of exposure W1 for an exposure in the area of the first macroline $MZ_1$ is placed, for example, as illustrated in FIG. 11, such that it covers the components 34 which are arranged along one row 36, wherein the component 34 are the components on one substrate member 28.

Proceeding from the aim of writing the M macrolines MZ as far as possible without interrupting the movement in the main direction X, the control memory 52 is to be selected to be only of such a size that it can store somewhat more than half the macrolines MZ when the transfer of the sets of data from the main memory 54 to the control memory 52 and the storing thereof can take place so quickly that it is possible to save approximately half the sets of data of an additional macroline MZ not yet saved in the control memory 52 during the pass along the path of exposure W1 from its beginning W1A to its end W1E which covers all the components 34 along the row 36x.

It is then possible to process, first of all, all the macrolines saved in the control memory 52 by running corresponding paths of exposure W, wherein as a result of the storing of additional macrolines MZ from the main memory 54, which constantly takes place, approximately half the macrolines MZ already processed are always newly saved and so, altogether, a size of the control memory 52 is sufficient which can store between 50 and 60% of the sets of data of the M macrolines of the component 34.

In view of the given premises, the size of the control memory 52 may, however, be reduced even further when the path of exposure W is lengthened.

If, for example, the path of exposure W'1 illustrated in FIG. 11 is run, which covers from its beginning W'1A as far as its end W'1E the components 34 which are arranged along two rows 36Y and 36Y+1, it is already possible at the same speed in the main direction X and the same data transfer rate from the main memory 54 to the control memory 52, which are the basis for the above assumptions, to store the sets of data of an entire additional macroline MZ in the control memory 52 during the pass along the path of exposure W'1.

This means that it is possible per path of exposure W', during the course of which only sets of data of one macroline MZ, for example, the macroline M1 are read out, to store all the sets of data of an additional macroline, for example, the macroline $MZ_2$ in the control memory 52 from the main memory 54.

In this case, the control memory 52 must merely be selected to be of such a size that it is in a position to store the sets of data of two macrolines MZ, namely the sets of data which are read out for the respective macroline MZ during the course of the path of exposure W' and the sets of data which are read into the control memory 52 from the main memory 54 and stored for the next macroline MZ to be exposed.

Figure 12:
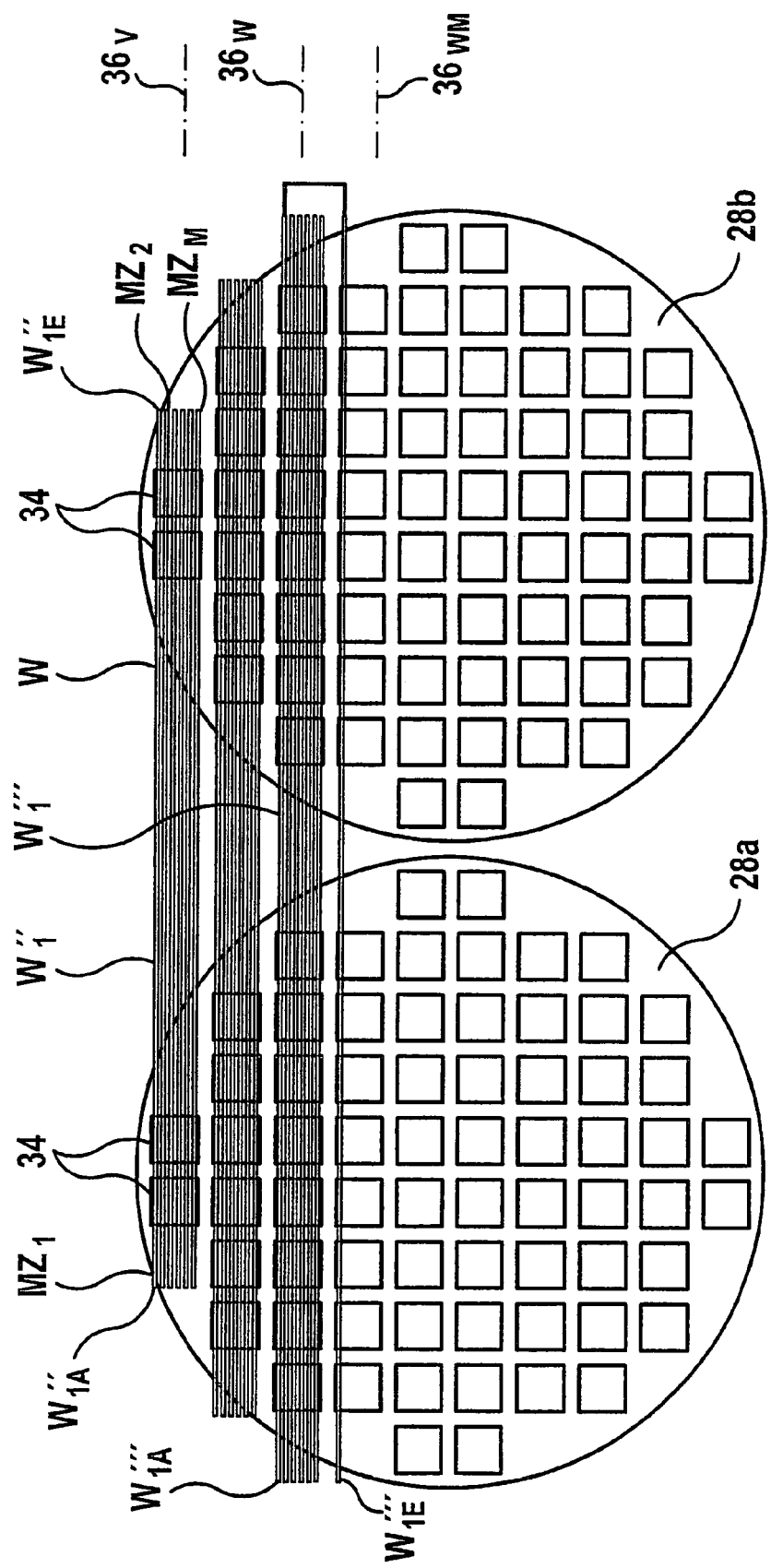
FIG. 12 shows a schematic illustration of two additional possibilities for realizing a path of exposure.

The time which is required for a path of exposure may, however, also be increased further in that not only one substrate member 28 is arranged on the substrate carrier 26 but rather two substrate members 28a, b, wherein the defined structures 32 of the components 34 which are to be produced are identical (FIG. 12).

Furthermore, the components 34 on both substrate members 28a, b are to be arranged such that they are respectively located in a common row 36.

In this case, the time which is required for the pass along the respective path of exposure W, in this case the path of exposure W1", is increased in that the path of exposure W1" covers the components 34 which are arranged along the row 36 on both substrate members 28a, b.

The time required for the pass along the path of exposure W1" from its beginning W1"A as far as its end W1"E is automatically longer than the time for the pass along the path of exposure W1, illustrated in FIG. 12, and is preferably in the order of magnitude of the time for the pass along the path of exposure W1", illustrated in FIG. 12, but with the advantage that for the pass along the path of exposure W1" only a straight-line movement in the main direction X is necessary and no movement in the secondary direction Y and so, for example, for the opposite movement in the main direction X the writing of an additional macroline MZ can already be provided.

If, however, the movement in the main direction X takes place very quickly or the data transfer rate for the transfer and storing of the sets of data of a macroline MZ from the main memory 54 to the control memory 52 is low, an additional increase in the time for the pass along the path of exposure W may be achieved when, as in FIG. 12, an exposure takes place in the case of the components 34 of two substrate members 28a, b in the area of a macroline MZ along the path of exposure W1″ which covers the components 34 of two rows 36W and 36W+1 located, for example, next to one another and, therefore, is at least double the length of the path of exposure W″.

Figure 13:
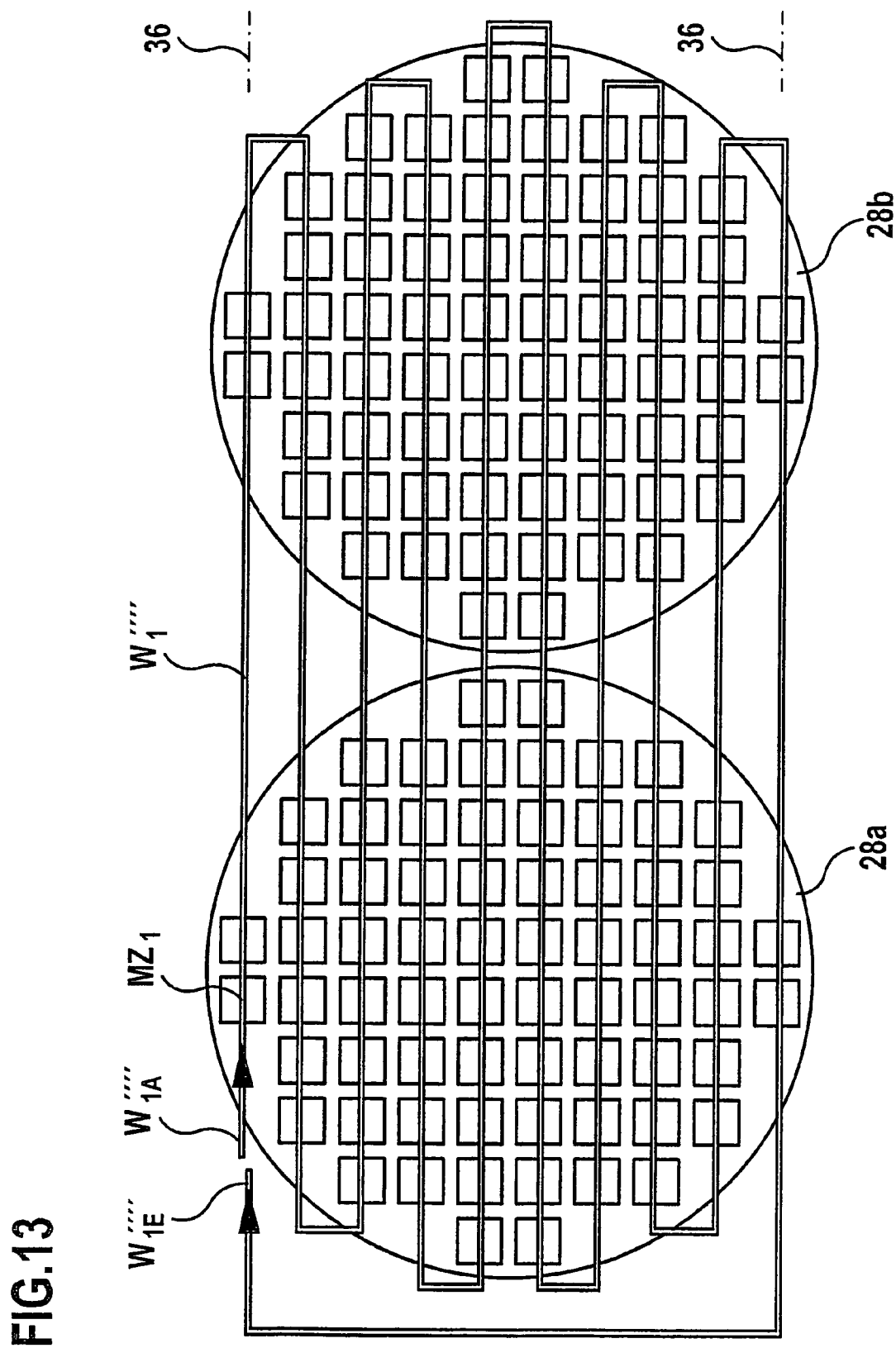
FIG. 13 shows a schematic illustration of an additional possibility for realizing a path of exposure.

If the movement in the main direction X is very quick and the data rates for the transfer of the sets of data from the main memory 54 to the control memory very low, a path of exposure W1‴ may be chosen in the extreme case, as illustrated in FIG. 13, and this provides for the same macroline MZ, for example, the macroline $MZ_1$ on all the components 34 of all the substrate members 28a, b of the substrate carrier 26 to be covered by the path of exposure W1‴.

In the case, for example, of two substrate members 28a, b present on the substrate carrier 26, this is the maximum possible length of a possible path of exposure W which, therefore, also makes available the maximum possible time for transferring the sets of data of an additional macroline MZ from the main memory 54 to the control memory 52 and to store them in this memory.

The use of a plurality of, for example, several hundreds of light sources 44 and the simultaneous activation thereof with the control 50 likewise go to the very limits of the component parts which can be used for such a control 50 and such a control memory 52.

Figure 14:
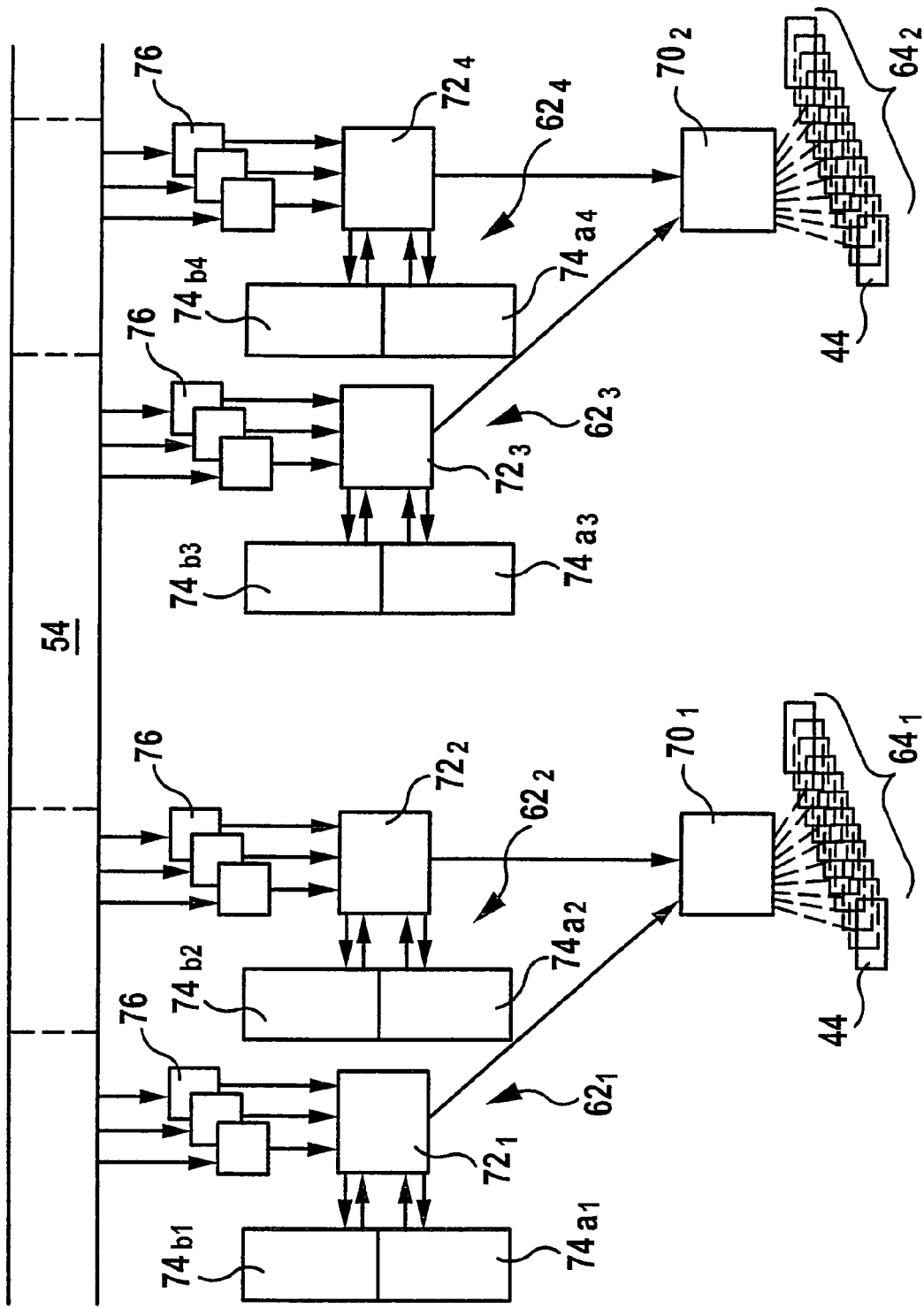
FIG. 14 shows a schematic illustration of an embodiment of a control in the case of light sources combined to form a group of light sources as well as a schematic illustration of a structure of a control memory which is as inexpensive as possible.

For this reason, the totality of the light sources 44 in the groups 64 of light sources is divided up, wherein each group 64 of light sources comprises approximately 20 to 40 light sources, preferably 25 to 35 light sources. In the embodiment illustrated, each group of light sources comprises 28 light sources 44 (FIG. 14).

With such a structure of the groups 64 of light sources, the control 50 is divided into individual group controls 70, wherein each group control 70 operates independently of the other group control in order to activate simultaneously the group 64 of light sources associated with it, preferably, drivers of the individual light sources 44 of the group 64 of light sources.

Furthermore, the control memory 52 is also divided up. The control memory 52 is preferably formed from a plurality of control memory units 62, wherein each control memory unit 62 has a control module 72 which interacts with several control memory modules 74, preferably designed as RAM. For example, each control module 72 interacts with two control memory modules 74a, b or an even greater number of control memory modules 74 (FIG. 14).

The control module 72 itself is preferably designed as so-called RAM FPGA and serves the purpose of, on the one hand, reading sets of data out of the respective control memory module 74 and, however, also reading sets of data into it at the same time.

The transfer of sets of data from the main memory 54 is brought about by so-called interface modules 76, in particular, USBs which are provided between the main memory 54 and the respective control module 72 for the parallel transfer of the sets of data from the main memory 54, wherein the control module 72, for its part, again stores these sets of data in the control memory modules 74.

Each of the group controls 70 operating independently of one another is preferably associated not only with one control memory unit 62 but rather several control memory units 62 are provided per group control 70. In the case illustrated in FIG. 14, each of the group controls $70_1$ and $70_2$ has two control memory units $62_1$ and $62_2$ or $62_3$ and $62_4$, respectively, associated with it.

Each of the groups 64 of light sources is therefore in a position to carry out exposure in some of the plurality V of lines Z of one macroline MZ.

Since—as already explained—one line strip ZS comprising several lines Z is preferably associated with each light source 44, the number T of the lines Z, in which exposure can be carried out by means of a group 64 of light sources, corresponds to the number of lines Z per line strip ZS multiplied by the number Q of light sources 44 per group 64 of light sources.

Figure 15:
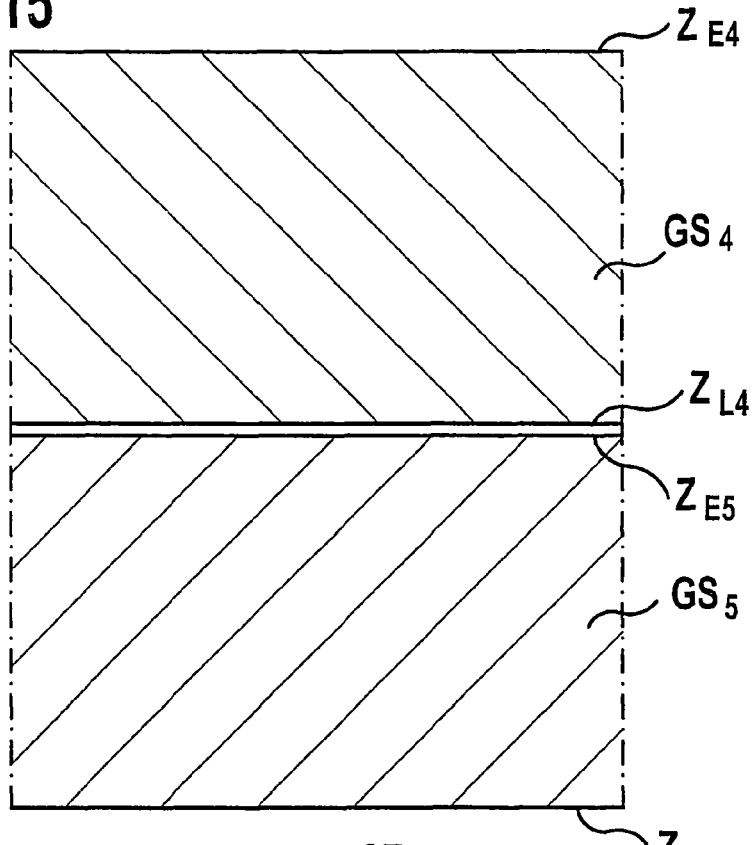
FIG. 15 shows a schematic illustration of the positioning relative to one another of group strips located next to one another.

The number T of lines Z which is therefore associated with a group 64 of light sources forms, altogether, a group strip GS extending in the main direction X. As long as the structure lines provided for the defined structure remain clearly allocated to the lines Z, the group strips GS can be arranged such that in the case of group strips bordering on one another, for example, the group strips $GS_4$ and $GS_5$ in FIG. 15, the first line $ZE_5$ of the group strip $GS_5$ following the group strip $GS_4$ is arranged at the grid spacing RY from the last line $ZL_4$ of the group strip $GS_4$.

In the case of the relative positioning of the exposure unit 10, in particular, of the optics head 12 in relation to the substrates 28a, b on the substrate carrier 26, a positioning error in the secondary direction Y is, however, possible and this must be corrected, in particular, when several defined structures 32 are placed one on top of the other and these are intended to be positioned exactly relative to one another.

A positioning error of this type in the secondary direction Y may be compensated for by the drive for the positioning of the carrier slide 32.

A particularly advantageous embodiment does, however, provide for a rough positioning in the secondary direction Y to be brought about with the carrier slide 22 while a fine positioning of the structures 32 relative to one another, including a parallel displacement in Y direction, is brought about by varying allocation of the sets of data of structure lines SZ defining the structure 32 to the individual lines Z, in which exposure can be carried out.

This means that the total number G of lines Z, in which exposure of the substrate 28 is possible in the area of the respective component 34 with the exposure unit 10, is greater than the total number S of structure lines SZ, in the area of which exposure is necessary in order to generate the defined structure 32.

This means that an allocation of the structure lines SZ to the lines Z, in which exposure of the substrate member 28 is possible, can be kept variable.

Figure 16:
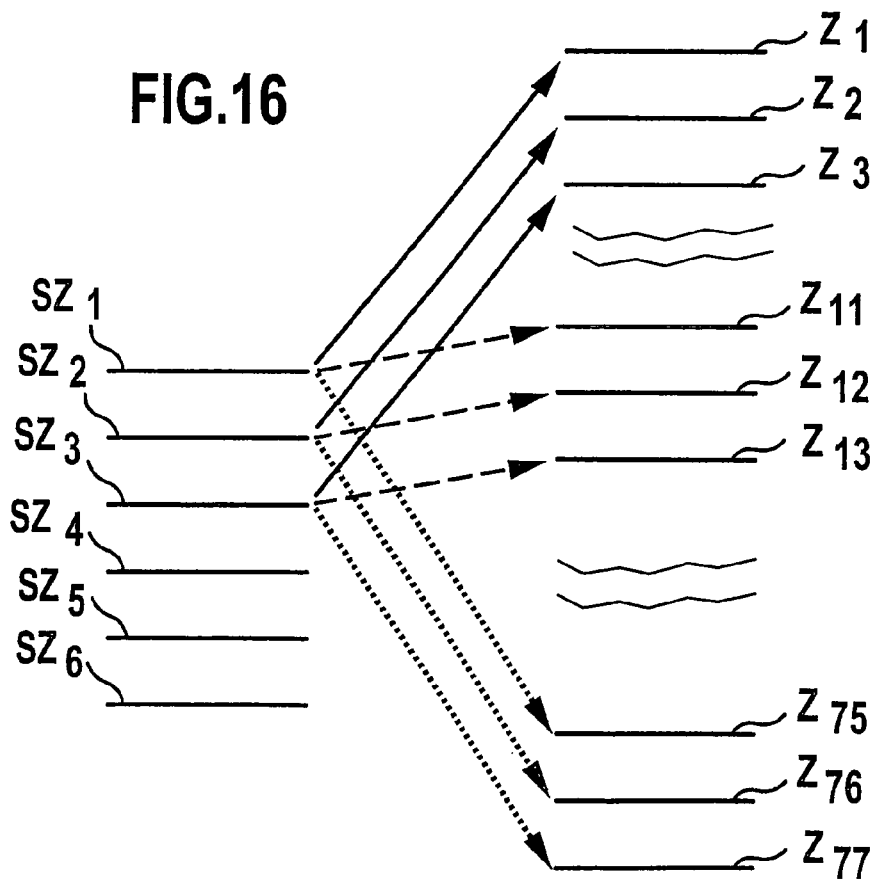
FIG. 16 shows a schematic illustration of a varying allocation of structure lines to lines exposable with the exposure unit.

For example, it is conceivable to allocate the first structure line $SZ_1$ to the first line $Z_1$ of the macroline MZ, in which exposure is to be carried out, as illustrated in FIG. 16 by the arrows drawn in solid lines. The next following structure line $SZ_2$ and subsequent lines are then allocated to the next following line $Z_2$ and subsequent lines.

It is, however, also conceivable to allocate, by means of the control 50, the first structure line $SZ_1$, for example, to the eleventh line $Z_{11}$ of the macroline MZ, in which exposure can be carried out, as illustrated in FIG. 16 by dashed arrows, or, as illustrated in FIG. 14 by dotted arrows, to allocate the first structure line $SZ_1$ to the 75th line $Z_{75}$ of the macroline MZ, in which exposure can be carried out.

The consequence of the variable allocation of the structure lines SZ to the lines Z actually to be written by the control— when only the macrolines are considered—is that the number of sets of data to be stored in the control memory 52 is greater since not only the sets of data for the total number V of lines Z of the macroline actually to be written must be stored for each macroline MZ located between the first and last macrolines MZ1 and MZM but, in addition, the number U of lines bordering on the respective macroline MZ on both sides, wherein the number U of lines corresponds to half the maximum possible shift in the association of structure lines SZ and lines which can, however, be altered by the control 50 when activating the light sources 44.

The consequence of such an alteration in the allocation of the structure lines SZ relative to the lines Z, in which exposure can actually be carried out, is that when groups 64 of light sources are provided and group controls 70 associated with these groups 64 of light sources and operating independently of one another, the possibility of altering the allocation for each of the groups strips GS which is generated by a group 64 of light sources is to be taken into consideration. This means that from the total number of the structure lines SZ not only a subset of sets of data which corresponds exactly to a number T of lines Z, in which exposure can actually take place, may be made available to each of the group controls 70, as illustrated in FIG. 17, but rather a subset of sets of data of the total number of structure lines must be made available which is increased by a number U in relation to the number of the lines Z of a group strip GS on both sides of the group strip GS.

For example, not only the sets of data of the structure lines SZE1 to SZL1, which are necessary for the exposure within an area of T possible lines Z of the group strip $GS_4$, are to be made available for the exposure within the group strip $GS_4$ but rather sets of data from the structure line $SZ_{(E-U)4}$ as far as the structure line $SZ_{(L+U)4}$ so that it is still possible with the group control 70 to carry out exposure within the structure lines $SZ_{(E-U)4}$ and $SZ_{(L-U)4}$ which, in this case, would be allocated to the lines $Z_{E1}$ to $Z_{L4}$ or to shift the allocation to such an extent that exposure is carried out in the area of the structure lines $SZ_{(E+U)4}$ and $SZ_{(L+U)4}$ which, in this case, would be allocated to the lines $Z_{E4}$ to $Z_{L4}$ of the group strip $GS_4$.

As a result, the amount of data which is to be stored for each of the group controls 70 in the control memory modules 74 associated with it is increased overall.

Figure 17:
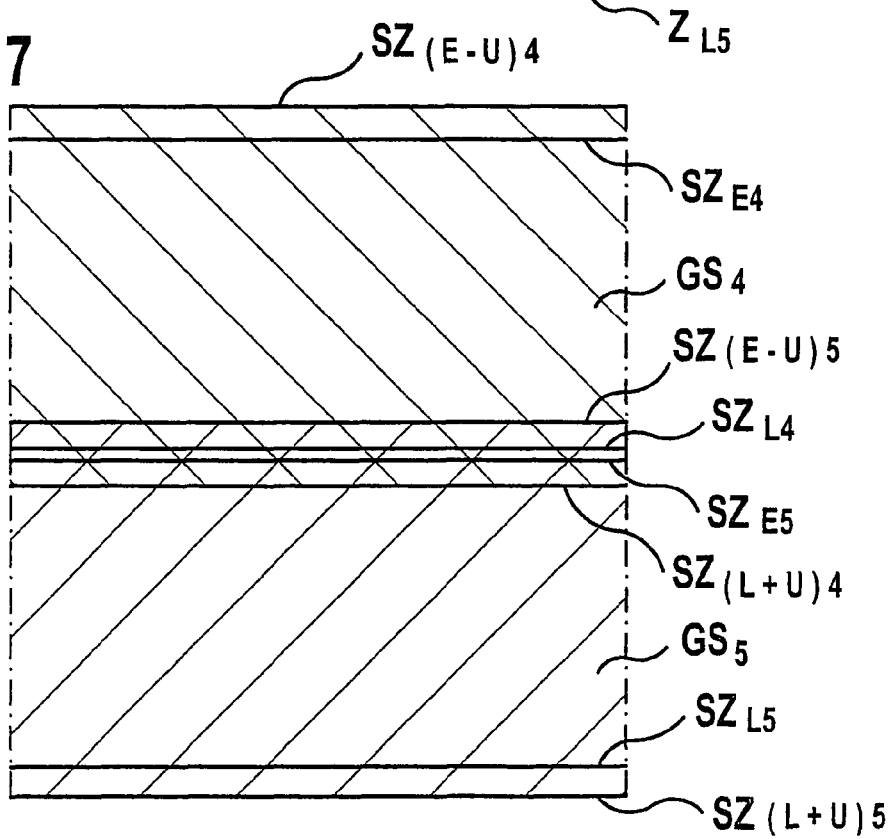
FIG. 17 shows a schematic illustration of the allocation of structure lines to a group of light sources during actual exposure in the area of a group strip.

Furthermore, it is shown in FIG. 17 that the subset of structure lines $SZ_{(E-U)4}$ to $SZ_{(L+U)4}$ made available to the groups 64 of light sources generating the group strip $GS_4$ and the subset of structure lines $SZ_{(E-U)5}$ to $SZ_{(L+U)5}$ made available to the group 64 of light sources generating the group strip $GS_5$ overlap in an overlapping area UB and, therefore, the same structure lines $SZ_{(E-U)5}$ to $SZ_{(L+U)4}$ must be made available for each of the groups 64 of light sources in this area.

Figure 18:
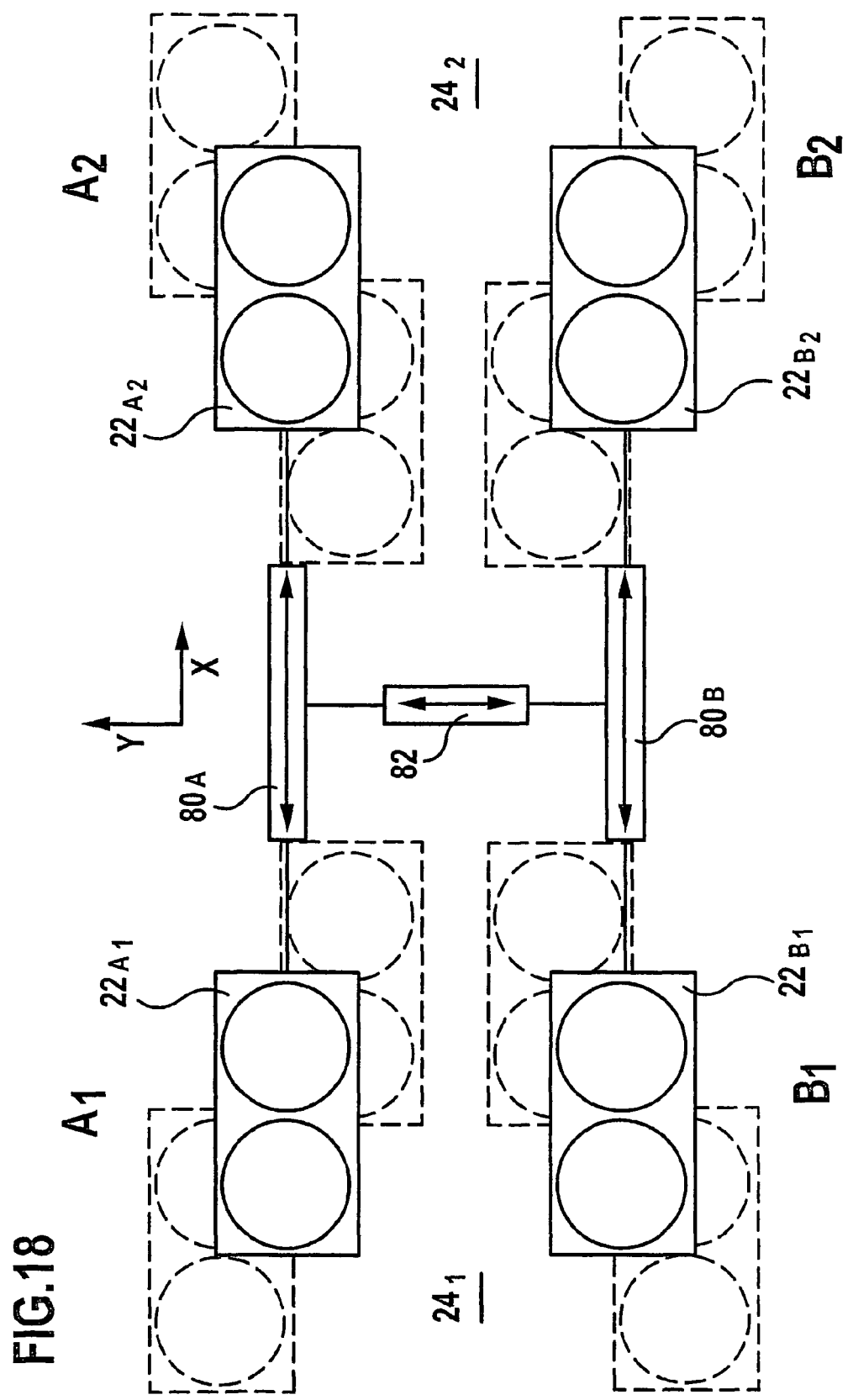
FIG. 18 shows a schematic illustration of a second embodiment of an exposure device with several substrate carriers as well as the relative movement of the substrate carriers in relation to one another and FIG. 19 shows a schematic illustration similar to FIG. 14 of a third embodiment of an exposure device.
Figure 19:
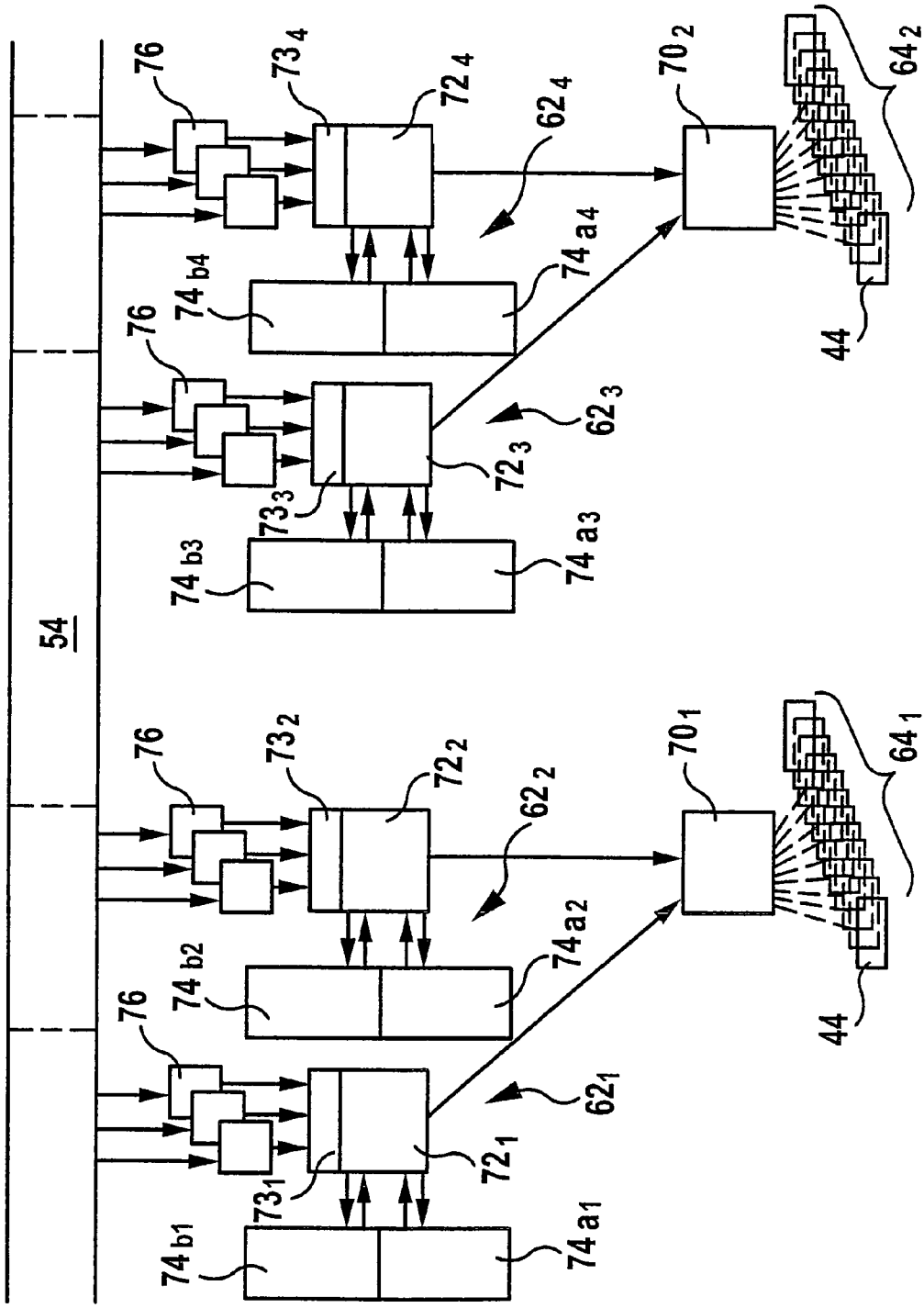

In a second embodiment of a device according to the invention—illustrated in FIG. 18—for the exposure of substrates, in particular, corresponding to one of the methods described above, altogether four devices $A_1, A_2, B_1, B_2$ are provided for the exposure of substrate members 28, as illustrated in FIG. 18, wherein for reasons of simplification only their carrier slides $22A_1, 22A_2, 22B_1, 22B_2$ are illustrated and the exposure unit 10 of the individual devices is not illustrated.

For example, the carrier slides $22A_1$ and $22B_1$ are guided on a plane of guidance $24_1$ while the carrier slides $22A_2$ and $22B_2$ are guided on a separate plane of guidance $24_2$.

Furthermore, a common drive unit 80A is provided for the carrier slides $22A_1$ and 22A2 and a common drive unit 80B for the carrier slides $22B_1$ and $22B_2$, these drive units each serving to move the carrier slides $22A_1$ and $22A_2$ or $22B_1$ and $22B_2$, respectively, in the main direction X, namely such that the movement takes place in the opposite direction to one another, i.e., with a phase shift of 180°, i.e., the two carrier slides $22A_1$ and $22A_2$ or $22B_1$ and $22B_2$, respectively, are moved by the drive unit 80A and 80B, respectively, either towards one another or away from one another.

In addition, the drive units 80A and 80B can, for their part, be moved relative to one another, namely by a common drive unit 82 for a movement in the secondary direction Y.

As a result of the common drive unit 82, the pairs of carrier slides formed, on the one hand, by the carrier slides $22A_1$ and $22A_2$ and, on the other hand, formed by the carrier slides $22B_1$ and $22B_2$ can be moved in pairs in the secondary direction, namely likewise towards one another or away from one another. This means that either the carrier slides 22A1 and $22B_1$ or $22A_2$ and $22B_2$, respectively, are moved towards one another or away from one another.

As a result of drive units 80A and 80B as well as 82 operating in such a manner, it is possible to compensate to as great an extent as possible for inertia forces during the acceleration of the carrier slides $22A_1$, $22A_2$, $22B_1$ and $22B_2$, wherein this preferably presupposes that the substrate members 28 on all these carrier slides $22A_1$, $22A_2$, $22B_1$ and $22B_2$ are intended to be provided with components 34 having the same structures 32.

What is claimed is:

1. Method for producing exposed structures on a plurality of components arranged on at least one substrate member by means of an exposure unit, wherein:
   the at least one substrate member arranged on a substrate carrier and the exposure unit are moved relative to one another in a main direction (X) and transversely to the main direction (X) in a secondary direction (Y),
   identical structures are produced on at least some of the components,
   each of the identical structures is produced by way of exposure of the at least one substrate member in an area of the component respectively provided within a plurality (M) of macrolines (MZ) extending in the main direction (X) and lying next to one another in the secondary direction (Y),
   each of the macrolines (MZ) comprises a plurality (V) of lines (Z) extending in the main direction (X) and lying next to one another in the secondary direction (Y),
   during a single pass along a path of exposure (W) all the components to be provided with identical structures and covered by the path of exposure (W) are exposed with the exposure unit in an area of the same macroline (MZ) of the plurality (M) of macrolines (MZ), and
   the exposure unit has a plurality (N) of light sources, a control activating the light sources essentially at the same time, and a control memory constructed such that sets of data already stored for the macroline (MZ), in the area of which exposure is being carried out, are able to be read from said memory while sets of data of an additional macroline (MZ) are being stored.

2. Method as defined in claim 1, wherein the path of exposure (W) is selected to be at least of such a length that a time for passing along the path of exposure (W) corresponds at least to a time required for storing at least half the sets of data of the additional macroline (MZ) in the control memory.

3. Method as defined in claim 2, wherein the path of exposure (W) is selected to be at least of such a length that a time for passing along the path of exposure (W) corresponds at least to a time required for storing at least two thirds of the sets of data of the additional macroline (MZ) in the control memory.

4. Method as defined in claim 1, wherein the path of exposure (W) is selected to be of such a length that a time for passing along the path of exposure (W) corresponds at least to a time required for storing the sets of data of the additional macroline (MZ) in the control memory.

5. Method as defined in claim 1, wherein the path of exposure (W) extends over only one substrate member.

6. Method as defined in claim 1, wherein the path of exposure (W) extends over several substrate members.

7. Method as defined in claim 1, wherein the path of exposure (W) extends in a straight line in the main direction (X).

8. Method as defined in claim 7, wherein the path of exposure (W) extends exclusively and in a straight line in the main direction (X).

9. Method as defined in claim 1, wherein the path of exposure (W) extends in the main direction (X) and the secondary direction (Y).

10. Method as defined in claim 1, wherein the path of exposure (W) extends in a meandering shape.

11. Method as defined in claim 1, wherein the components are arranged on the at least one substrate member in rows extending parallel to the main direction (X).

12. Method as defined in claim 11, wherein the path of exposure (W) covers at least one row of the components.

13. Method as defined in claim 12, wherein the path of exposure (W) covers all the components arranged in a row extending in the main direction (X) on one substrate carrier.

14. Method as defined in claim 12, wherein the path of exposure (W) covers several rows of the components.

15. Method as defined in claim 14, wherein the several rows of the components are located next to one another.

16. Method as defined in claim 12, wherein the path of exposure (W) covers one row of the components in the main direction (X) and then switches transversely to the main direction (X) to an additional row of the components and covers the additional row of components.

17. Method as defined in claim 16, wherein the path of exposure (W) passes along the additional row in an opposite direction of travel to the one row.

18. Method as defined in claim 16 wherein the additional row is the next row following the one row in the secondary direction (Y).

19. Method as defined in claim 1, wherein the entire plurality (N) of light sources of the exposure unit is provided for the exposure of the plurality (V) of lines (Z) of one macroline (MZ).

20. Method as defined claim 1, wherein the control memory communicates via an interface with at least one main memory storing at least the sets of data of the plurality (M) of macrolines (MZ) of one component.

21. Method as defined in claim 20, wherein the sets of data are stored in the at least one main memory in a volume-reduced data format and prior to the sets of data being read into the control memory a conversion into a machine-oriented data format is carried out.

22. Method as defined in claim 21, wherein the volume-reduced data format is a vector data format.

23. Method as defined in claim 21, wherein the machine-oriented data format is a pixel data format.

24. Method as defined in claim 21, wherein the conversion of the data format takes place immediately prior to a transfer of data to the control module.

25. Method as defined in claim 1, wherein the control memory comprises several control memory modules and the control communicates with the several control memory modules of the control memory at the same time.

26. Method as defined in claim 25, wherein the several control memory modules are combined by means of a control module to form a control memory unit and communicate via the control memory unit with the control.

27. Method as defined in claim 26, wherein a storing of sets of data from the at least one main memory in the control memory modules takes place via the control modules.

28. Method as defined in claim 26, wherein the control receives sets of data from several control memory units for the simultaneous activation of the light sources.

29. Method as defined claim 1, wherein the control memory associated with the control is designed for storing at least two macrolines (MZ).

30. Method as defined in claim 1, wherein the control memory associated with the control is designed for storing less than half the plurality (M) of macrolines (MZ) of one of the components.

31. Method as defined in claim 30, wherein the control memory associated with the control is designed for storing less than a quarter of the plurality (M) of macrolines (MZ) of one of the components.

32. Method as defined in claim 1, wherein the plurality (N) of light sources is formed from a plurality of groups of light sources.

33. Method as defined in claim 32, wherein each group of light sources has its own group control associated with it and the light sources of the group of light sources are controlled by the group control exclusively and independently of the other groups of light sources.

34. Method as defined in claim 1, wherein:
a number (S) of structure lines (SZ) defining the structure of each of the components is smaller than the total number (G) of lines (Z),
an exposure in the area of the component being carried out in the lines (Z) by means of the exposure unit, and
a fine positioning in the secondary direction (Y) is brought about by a change in an allocation of the structure lines (SZ) to the lines (Z) exposable with the exposure unit.

35. Method as defined in claim 34, wherein the change in the allocation is carried out by the control.

36. Method as defined in claim 35, wherein sets of data of a number of the structure lines (SZ) are stored for each macroline (MZ) in the control memory, said number of structure lines being greater than the plurality (V) of the lines (Z) exposable by the exposure unit in the area of this macroline (MZ).

37. Method as defined in claim 34, wherein:
each group of light sources has its own group control associated with it and the light sources of the group of light sources are controlled by the group control exclusively and independently of the other groups of light sources,
sets of data for a subset of the structure lines (SZ) of the structure to be exposed are made available to the group control, and
the number of the structure lines of the subset is greater than the number of the lines (Z) actually exposable by the group of light sources within a group strip (GS).

38. Method as defined in claim 37, wherein the sets of data of the subsets of the structure lines (SZ) of the structure to be exposed, and said sets of data being made available to the groups of light sources located next to one another, comprise structure lines (SZ) contained in both subsets.

39. Method as defined in claim 38, wherein the structure lines (SZ) contained in both subsets form an overlapping area (UB) and the remaining structure lines (SZ) of the subsets are respectively located on opposite sides of the overlapping area (UB).

40. Method as defined in claim 1, wherein a line strip (ZS) comprising several lines (Z) is exposable with each light source.

41. Method as defined in claim 1, wherein several exposure devices ($A_1, A_2, B_1, B_2$), each comprising a substrate carrier and an exposure unit carrying out a relative movement in relation to one another, are used.

42. Method as defined in claim 41, wherein with two exposure devices ($A_1, A_2, B_1, B_2$) the relative movements in the main direction (X) take place in opposite directions.

43. Method as defined in claim 41, wherein with two exposure devices ($A_1, A_2, B_1, B_2$) the relative movements in the secondary direction (Y) take place in opposite directions.

44. Method as defined in claim 41, wherein four exposure devices ($A_1, A_2, B_1, B_2$) are used and for respective pairs, the relative movements in the main direction (X) and the relative movements in the secondary direction (Y) take place in opposite directions.

45. Device for producing exposed structures on at least one substrate member by means of an exposure unit, wherein:
  the at least one substrate member arranged on a substrate carrier and the exposure unit are movable relative to one another in a main direction (X) and transversely to the main direction (X) in a secondary direction (Y),
  the exposed structures are producible by way of exposure of the at least one substrate member within a plurality (M) of macrolines (MZ) extending in the main direction (X) and lying next to one another in the secondary direction (Y),
  each of the macrolines (MZ) comprises a plurality (V) of lines (Z) extending in the main direction (X) and lying next to one another in the secondary direction (Y), and
  the exposure unit has a plurality (N) of light sources, a control activating the light sources essentially at the same time, and a control memory designed such that sets of data already stored for the macroline (MZ), in the area of which exposure is being carried out, are readable from said memory while sets of data of an additional macroline (MZ) are being stored.

46. Device as defined in claim 45, wherein the entire plurality (N) of light sources of the exposure unit is provided for the exposure of the plurality (V) of lines (Z) of a macroline (MZ).

47. Device as defined in claim 45, wherein the control memory communicates via an interface with at least one main memory storing at least the sets of data of the plurality (M) of macrolines (MZ).

48. Device as defined in claim 47, wherein the sets of data are:
  stored in the at least one main memory in a volume-reduced data format, and
  convertible into a machine-oriented data format by a converter prior to being read into the control memory.

49. Device as defined in claim 48, wherein the volume-reduced data format is a vector data format.

50. Device as defined in claim 48, wherein the machine-oriented data format is a pixel data format.

51. Device as defined in claim 48, wherein the conversion of the data format takes place with a converter arranged directly in front of the control module.

52. Device as defined in claim 45, wherein the control memory comprises several control memory modules and the control communicates with the several control memory modules of the control memory at the same time.

53. Device as defined in claim 52, wherein several control memory modules are combined by means of a control module to form a control memory unit and communicate via the control memory unit with the control.

54. Device as defined in claim 53, wherein a storing of sets of data from the at least one main memory in the control memory modules takes place via the control modules.

55. Device as defined in claim 53, wherein the control receives sets of data from several control memory units for the simultaneous activation of the light sources.

56. Device as defined in claim 45, wherein the control memory associated with the control is designed for storing at least two macrolines (MZ).

57. Device as defined in claim 45, wherein the control memory associated with the control is designed for storing less than half the plurality (M) of macrolines (MZ).

58. Device as defined in claim 57, wherein the control memory associated with the control is designed for storing less than a quarter of the plurality (M) of macrolines (MZ).

59. Device as defined in claim 45, wherein the plurality (N) of light sources is formed from a plurality of groups of light sources.

60. Device as defined in claim 59, wherein each group of light sources has its own group control associated with it and the light source of the group of light sources are controlled by the group control exclusively and independently of the other groups of light sources.

61. Device as defined in claim 45, wherein a line strip (ZS) comprising several lines (Z) is exposable with each light source.

62. Device as defined in claim 45, wherein several exposure devices ($A_1, A_2, B_1, B_2$), each comprising a substrate carrier and an exposure unit carrying out a relative movement in relation to one another, are used.

63. Device as defined in claim 62, wherein with two exposure devices (A1, A2, B1, B2) the relative movements in the main direction (X) take place in opposite directions.

64. Device as defined in claim 62, wherein with two exposure devices ($A_1, A_2, B_1, B_2$) the relative movements in the secondary direction (Y) take place in opposite directions.

65. Device as defined in claim 62, wherein four exposure devices ($A_1, A_2, B_1, B_2$) are used and for respective pairs, the relative movements in the main direction (X) and the relative movements in the secondary direction (Y) take place in opposite directions.

66. Method for producing exposed structures in at least one area on at least one substrate member by means of an exposure unit, wherein:
  the at least one substrate member arranged on a substrate carrier and the exposure unit are moved relative to one another in a main direction (X) and transversely to the main direction (X) in a secondary direction (Y),
  structures are produced on the at least one area,
  each of the structures is produced by way of exposure of the at least one substrate member in the at least one area within a plurality (M) of macrolines (MZ) extending in the main direction (X) and lying next to one another in the secondary direction (Y),
  each of the macrolines (MZ) comprises a plurality (V) of lines (Z) extending in the main direction (X) and lying next to one another in the secondary direction (Y),
  during a single pass along a path of exposure (W) the at least one area to be provided with the structures and covered by the path of exposure (W) is exposed with the exposure unit in an area of the same macroline (MZ) of the plurality (M) of macrolines (MZ), and
  the exposure unit has a plurality (N) of light sources, the plurality (N) of light sources being formed from a plurality of groups of light sources, each group of light sources having its own group control associated with it and the light sources of the group of light sources is activated and controlled by the group control exclusively and independently of the other groups of light sources, the exposure unit having a control memory adapted such that sets of data already stored for the macroline (MZ), in the area of which exposure is being carried out, are able to be read from said memory, the control memory communicating via an interface with at least one main memory storing at least the sets of data of the plurality (M) of macrolines (MZ), the control memory comprising a plurality of control memory units, at least one of the control memory units being associated with one of said group controls, each control memory unit comprising several control memory modules combined by means of a control module.

67. Method as defined in claim 66, wherein a storing of sets of data from the at least one main memory in the control memory modules takes place via the control modules.

68. Method as defined in claim 66, wherein the sets of data are stored in the at least one main memory in a volume-reduced data format and prior to the sets of data being read into the control memory a conversion into a machine-oriented data format is carried out.

69. Method as defined in claim 68, wherein the conversion of the data format takes place immediately prior to a transfer of data to the control module.

70. Method as defined in claim 66, wherein the volume-reduced data format is a vector data format.

71. Method as defined in claim 66, wherein the machine-oriented data format is a pixel data format.

72. Device for producing exposed structures on at least one substrate member by means of an exposure unit, wherein:

the at least one substrate member arranged on a substrate carrier and the exposure unit are movable relative to one another in a main direction (X) and transversely to the main direction (X) in a secondary direction (Y), the exposed structures are producible by way of exposure of the at least one substrate member within a plurality (M) of macrolines (MZ) extending in the main direction (X) and lying next to one another in the secondary direction (Y), each of the macrolines (MZ) comprises a plurality (V) of lines (Z) extending in the main direction (X) and lying next to one another in the secondary direction (Y), and the exposure unit has a plurality (N) of light sources, the plurality (N) of light sources being formed from a plurality of groups of light sources, each group of light sources having its own group control associated with it and the light sources of the group of light sources are controlled by the group control, the exposure unit having a control memory designed such that sets of data already stored for the macroline (MZ), in an area of which exposure is being carried out, are readable from said memory, the control memory communicating via an interface with at least one main memory storing at least the sets of data of the plurality (M) of macrolines (MZ), the control memory comprising a plurality of control memory units, at least one control memory unit being associated with one of said group controls, each control memory unit comprising several control memory modules combined by means of a control module.

73. Device as defined in claim 72, wherein a storing of sets of data from the at least one main memory in the control memory modules takes place via the control modules.

74. Device as defined in claim 72, wherein the sets of data are stored in the at least one main memory in a volume-reduced data format, and convertible into a machine-oriented data format by a converter prior to being read into the control memory.

75. Device as defined in claim 74, wherein the volume-reduced data format is a vector data format.

76. Device as defined in claim 74, wherein the machine-oriented data format is a pixel data format.

* * * * *